(12) United States Patent
Sakurai et al.

(10) Patent No.: US 8,119,449 B2
(45) Date of Patent: Feb. 21, 2012

(54) METHOD OF MANUFACTURING AN ELECTRONIC PART MOUNTING STRUCTURE

(75) Inventors: Daisuke Sakurai, Osaka (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 628 days.

(21) Appl. No.: 12/278,481

(22) PCT Filed: Mar. 6, 2007

(86) PCT No.: PCT/JP2007/054280
§ 371 (c)(1), (2), (4) Date: Aug. 6, 2008

(87) PCT Pub. No.: WO2007/105535
PCT Pub. Date: Sep. 20, 2007

(65) Prior Publication Data
US 2009/0026634 A1 Jan. 29, 2009

(30) Foreign Application Priority Data

Mar. 14, 2006 (JP) .................... 2006-068801
Mar. 14, 2006 (JP) .................... 2006-069057

(51) Int. Cl.
*H01L 21/00* (2006.01)
(52) U.S. Cl. ........ 438/108; 438/118; 438/124; 438/126; 438/127; 438/614; 257/778; 257/783; 257/789; 257/795
(58) Field of Classification Search ........ 257/777, 257/778, 737, 738, 780, 781, 782, 783, 690, 257/789, 795; 438/108, 109, 116, 118, 119, 438/127, 612, 613, 614, 124, 126
See application file for complete search history.

(56) References Cited

U.S. PATENT DOCUMENTS

| | | | | |
|---|---|---|---|---|
| 5,705,302 A | * | 1/1998 | Ohno et al. | 430/7 |
| 5,846,853 A | * | 12/1998 | Otsuki et al. | 438/119 |
| 6,238,597 B1 | * | 5/2001 | Yim et al. | 252/512 |
| 6,465,879 B1 | * | 10/2002 | Taguchi | 257/673 |
| 7,262,511 B2 | * | 8/2007 | Osako et al. | 257/783 |
| 2007/0001313 A1 | * | 1/2007 | Fujimoto et al. | 257/778 |

FOREIGN PATENT DOCUMENTS

| | | |
|---|---|---|
| EP | 1 018 761 A1 | 7/2000 |
| JP | 62-097340 | 5/1987 |
| JP | 06-301190 | 10/1994 |
| JP | 08-204166 | 8/1996 |

(Continued)

OTHER PUBLICATIONS

Chinese Office Action issued in Chinese Patent Application No. 200780007249.3, mailed Mar. 26, 2010.

(Continued)

*Primary Examiner* — Ha Tran T Nguyen
*Assistant Examiner* — Thanh Y Tran
(74) *Attorney, Agent, or Firm* — McDermott Will & Emery LLP

(57) ABSTRACT

An electronic part mounting structure includes electronic part having a plurality of electrode terminals, a substrate provided with connection terminals in locations corresponding to these electrode terminals, and protruding electrode for connecting one of electrode terminals and one of connection terminals, where electrode terminal of electronic part and connection terminal of substrate are connected through protruding electrode and protruding electrode is formed of a conductive resin including a photosensitive resin and a conductive filler.

4 Claims, 11 Drawing Sheets

FOREIGN PATENT DOCUMENTS

| | | |
|---|---|---|
| JP | 8-204166 | 8/1996 |
| JP | 10-112474 | 4/1998 |
| JP | 11-233669 | 8/1999 |
| JP | 2000-022305 | 1/2000 |
| JP | 2000-357710 | 12/2000 |
| JP | 2001-189337 | 7/2001 |
| JP | 2001-252986 | 9/2001 |
| JP | 2002-299796 | 10/2002 |
| JP | 2003-023231 | 1/2003 |
| JP | 2004-22623 | 1/2004 |
| JP | 2004-253544 | 9/2004 |
| JP | 2005-072262 | 3/2005 |
| KR | 2001-0022036 | 3/2001 |

OTHER PUBLICATIONS

Japanese Office Action issued in Japanese Patent Application No. 2006-068801, dated Jul. 6, 2010.

Japanese Office Action issued in Japanese Patent Application No. JP 2006-069057 dated Jan. 27, 2011.

Korean Office Action issued in Korean Patent Application No. 10-2008-7021148, mailed Feb. 24, 2011.

\* cited by examiner

METHOD OF MANUFACTURING AN ELECTRONIC PART MOUNTING STRUCTURE

RELATED APPLICATIONS

This application is the U.S. National Phase under 35 U.S.C. §371 of International Application No. PCT/JP2007/054280, filed on Mar. 6, 2007, which in turn claims the benefit of Japanese Application Nos. 2006-068801 and 2006-069057, both filed on Mar. 14, 2006, the disclosures of which Applications are incorporated by reference herein.

TECHNICAL FIELD

The present invention relates to an electronic part mounting structure where an electronic part, as typified by a semiconductor element, is mounted on a substrate or the like using a flip chip mounting, as well as its manufacturing method.

BACKGROUND ART

In recent years, wiring patterns have been miniaturized to, for example, 65 nm to 45 nm, on the basis of the miniaturization rule, in order to increase the storage density of semiconductor chips. Along with this miniaturization, the number of external connection terminals of semiconductor chips has increased, and the need for external connection terminals to be modified for a smaller pitch has become urgent. Meanwhile, external connection terminals have been formed in an area bump system, where the entire surface of the semiconductor chip on which the circuit is formed is used, in order to prevent the pitch of the external connection terminals from becoming too small, instead of in a conventional peripheral bump system. In addition, as the speed of operation of semiconductor chips increases, a porous, low dielectric material, for example, has started to be used as an insulating layer material used as a semiconductor element. Furthermore, the thickness of semiconductor chips has been reduced together with the reduction in the scale of electronic apparatus or the like inside which semiconductors chips are mounted.

However, thin semiconductor chips having a low dielectric material are generally fragile, and become cracked or damaged due to the load at the time of mounting. Furthermore, the crystal lattice in semiconductor chips becomes distorted due to heat and the like, so that the transistor properties and the like tend to fluctuate in a case of use in such a state that there remains stress at the time of mounting.

Therefore, bumps (protruding electrodes) that can be formed under a low mounting load are strongly in demand for external connection electrodes formed on semiconductor chips having a low mechanical strength with a fine pitch.

In order to solve these problems, forming of protruding electrodes in cone form or pyramid form and protruding electrodes using a conductive resin has been examined. For example, semiconductor devices where pointed conductive resin bumps, for example, are formed on semiconductor chips, and the semiconductor chips are mounted using these conductive resin bumps have been disclosed (see for example Patent Document 1). In addition, the conductive resin bumps in Patent Document 1 are formed using the following method. That is to say, the method includes the step of forming pointed holes on the main surface of a plate in such a manner that they correspond to electrode pads formed on a semiconductor chip, the step of filling these holes with a conductive resin, the step of positioning the plate so that the main surface of the plate and the surface of the semiconductor chip for holding electrode pads face each other and positioning the plate so that the holes and corresponding electrode pads on the semiconductor chip face each other; the step of overlapping the plate with the semiconductor chip, and the step of forming pointed conductive resin bumps on the electrode pads with making the conductive resin cured.

Here, in the step of forming holes, a single crystal silicon (Si) substrate having a (100) surface as the main surface is used as the plate, and a method for forming holes on the (100) surface in accordance with a wet etching method is shown. As a result, protruding electrodes having a height of, for example, 60 μm, and a dispersion of within 2.5 μm in accordance with standard deviation can be formed without forming a barrier metal on the external connection terminals of the semiconductor element. In addition, an inexpensive semiconductor device where reliable contact is possible can be obtained.

In addition, protruding electrodes in the area bump system which makes highly reliable connection possible and can absorb warps in a substrate (see for example Patent Document 2) have also been disclosed. The protruding electrodes in Patent document 2 have a two-stage form where smaller upper stage bumps are formed on top of lower stage bumps, and the modulus of elasticity of the upper bumps is smaller than the modulus of elasticity of the lower bumps in the configuration. As a result, the stress between the semiconductor element and the substrate can be sufficiently absorbed by the protruding electrodes themselves. In addition, in a case where a conductive adhesive is used, the protruding electrodes and the conductive adhesive can absorb more stress. As a result, in the semiconductor device using the above protruding electrodes, the reliability of the connection can be increased. Furthermore, even in a case where there is a warp in the substrate in the area bump system, the warp can be effectively absorbed. In addition, Patent Document 2 also shows that the upper bumps are formed of a photosensitive conductive resin and a metal film is formed on the surface of the formed bumps.

Meanwhile, methods for fabricating substrates on which semiconductor elements are mounted in a simple process have been examined. As one method, the method of forming an electrically insulating layer and a wiring layer in accordance with stereo lithography (see for example Patent Document 3) has been disclosed. In addition, the manufacturing method for a wiring board in Patent Document 3 is shown in the following. That is to say, the manufacturing method includes the step of forming an electrically insulating layer in accordance with stereo lithography using an insulating liquid resin, and the step of forming a wiring pattern in the wiring layer by photo-curing portions which form the wiring pattern in accordance with stereo lithography using a conductive liquid resin and removing the conductive liquid resin from portions other than the photo-cured portions.

In addition, a method for forming a three-dimensional structure using a liquid crystal mask through the above stereo lithography (see for example Patent Document 4) has also been disclosed.

According to the above Patent Document 1, holes formed on a single crystal silicon substrate are filled with a conductive resin, and protruding electrodes are formed on electrode terminals of semiconductor elements through transfer method, and therefore, protruding electrodes in pyramid form having little inconsistency in the height (thickness) can be obtained. In accordance with this method, however, though the inconsistency in the height of the protruding electrodes can be controlled, the height of the surface or the like of the protruding electrodes formed on the semiconductor element does not become constant in a case where there is a warp in the semiconductor element or the surface of the semiconductor element on which the protruding electrodes are formed is uneven. That is to say, the inconsistency in height between the rear surface of the semiconductor element and the peaks of the protruding electrodes cannot be reduced, and as a result, there is a problem, such that defects in mounting cannot be reduced.

In addition, in the protruding electrodes having a two-stage structure of Patent Document 2, the modulus of elasticity of the upper stage bumps is smaller than the modulus of elasticity of the lower stage bumps, and therefore, the inconsistency in the height of the bumps and the pressing force can be absorbed at the time of mounting. As the same as that in the above Patent Document 1, however, the height of the surface of the protruding electrodes formed on the surface of the semiconductor element does not become constant, and therefore, the inconsistency in the height between the rear surface of the semiconductor element and the peaks of the protruding electrodes cannot be reduced, and thus, there is the same problem as in Patent Document 1.

[Patent Document 1] Unexamined Japanese Patent Publication No. H10 (1998)-112474
[Patent Document 2] Unexamined Japanese Patent Publication No. 2001-189337
[Patent Document 3] Unexamined Japanese Patent Publication No. 2004-22623
[Patent Document 4] Unexamined Japanese Patent Publication No. 2001-252986

DISCLOSURE OF THE INVENTION

The electronic part mounting structure according to the present invention includes an electronic part having a plurality of electrode terminals, a substrate where connection terminals are provided in locations corresponding to the electrode terminals, and a protruding electrode for connecting one of the electrode terminals and one of the connection terminals, and has a configuration where the electrode terminal of the electronic part and the connection terminal of the substrate are connected through the protruding electrode, and the protruding electrode is formed of a conductive resin which includes a photosensitive resin and a conductive filler.

In this configuration, the protruding electrode made of a conductive resin can be formed collectively. Here, a liquid resin including the photosensitive resin is used, and thus, the liquid resin is selectively exposed using a photo mask where a plurality of liquid crystal cells are two-dimensionally aligned to be cured, so that the protruding electrode made of a conductive resin can be easily formed.

In addition, the manufacturing method for an electronic part mounting structure according to the present invention includes forming a protruding electrode made of a conductive resin including a photosensitive resin and a conductive filler on the electrode terminal of an electronic part or on a connection terminal of a substrate, positioning an electronic part or a substrate on which the protruding electrode is formed so that the electrode terminal and the connection terminal face each other with the protruding electrode interposed therebetween, and connecting the electrode terminal and the connection terminal with the protruding electrode interposed therebetween by pressing the electronic part.

In accordance with this method, an electronic part mounting structure where connection is made using the protruding electrode made of a conductive resin can be easily fabricated.

In addition, the manufacturing method for an electronic part mounting structure according to the present invention includes placing a transparent base through which light transmits, a substrate including a connection terminal which is formed on the surface of the transparent base and is made of a transparent conductive thin film through which at least light transmits, and an electronic part where an electrode terminal is provided in a location corresponding to the connection terminal with predetermined intervals, supplying a liquid resin including a photosensitive resin and a conductive filler to between the electronic part and the substrate, and collectively connecting a plurality of the connection terminals and a plurality of the electrode terminals by irradiating the liquid resin on the connection terminal with light through an opening in a photo mask from the surface on the side opposite to the surface facing the electronic part on the substrate selectively and while gradually increasing the light intensity so that the liquid resin is cured and the protruding electrode grows.

In accordance with this method, an electronic part can be mounted on a substrate made of a transparent base simply through irradiation with light, and therefore, the mounting step can be simplified.

Figure 1:
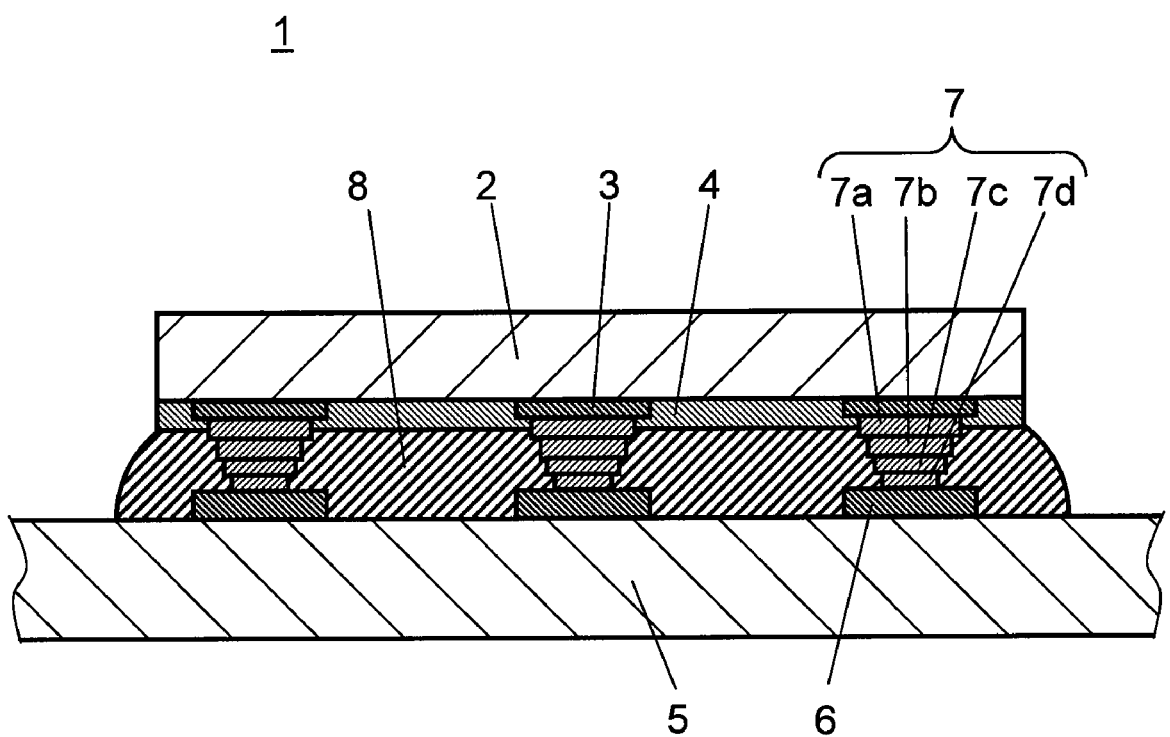
FIG. 1 is a cross sectional diagram showing the configuration of the electronic part mounting structure according to a first exemplary embodiment of the present invention.

EXPLANATION OF REFERENCE NUMERALS 1, 30, 65, 70 electronic part mounting structure
2, 32, 50, 72 electronic part (semiconductor element)
3, 33, 52, 57, 73 electrode terminal
4, 74 protective film
5, 35, 62, 75 substrate
6, 36, 55, 63, 76 connection terminal
7, 37, 60, 77 protruding electrode
7a, 37a, 37d, 60a, 77a first layer
7b, 37b, 60b, 77b second layer
7c, 37c, 60c, 77c third layer
7d fourth layer
8, 39, 61, 78 insulating resin
10, 20 container
15 semiconductor wafer
21 bottom
22 outer periphery portion
23, 40, 79 photo mask
23a, 40a first opening
23b, 40b second opening
24 liquid resin
25, 41, 80, 81, 82, 190 light (visible light)
33a lower stage side electrode terminal
33b upper stage side electrode terminal
34 first protective film
38 second protective film
40c third opening
51 semiconductor chip
53 die bonding material
54 wiring substrate
56 penetrating conductor
58 metal fine wire
59 sealing resin
79a, 210 opening
140 light source
150 optical system
160 liquid crystal panel
160a mask region
170 liquid crystal panel control apparatus
180 scale-down projection optical system
200 region
220 liquid crystal cell

PREFERRED EMBODIMENTS FOR CARRYING OUT OF THE INVENTION

Hereinafter, the exemplary embodiments of the present invention are described in reference to the drawings. Here, the same elements have the same reference numerals, and description thereof may not be given in some cases.

First Exemplary Embodiment

FIG. 1 is a cross sectional diagram showing the configuration of electronic part mounting structure 1 according to the first exemplary embodiment of the present invention. As shown in FIG. 1, electronic part mounting structure 1 is provided with electronic part 2 having a plurality of electrode terminals 3, substrate 5 where connection terminals 6 are provided in locations corresponding to electrode terminals 3, and protruding electrodes 7 which connect electrode terminals 3 and connection terminals 6. In addition, protruding electrodes 7 are formed of a conductive resin including a photosensitive resin and a conductive filler. Here, the photosensitive resin is sensitive to ultraviolet rays and visible light, and concretely, the peak sensitivity is to light having a wavelength of 500 nm or less. Hereinafter, visible light is taken as an example. At this time, protruding electrodes 7 have the modulus of elasticity of 5 to 30 in accordance with the dynamic hardness, and are sufficiently flexible in comparison with conventional gold bumps, of which the dynamic hardness is 60 to 90. Hereinafter, the material for forming the conductive resin and the properties thereof are described in detail, therefore they are not given here In addition, in the present exemplary embodiment, protruding electrodes 7 are truncated conical structures having four layers in the height (thickness) direction, and first layer 7a, second layer 7b, third layer 7c and fourth layer 7d are formed of the same material. Furthermore, insulating resin 8 is filled between electronic part 2 and substrate 5, so that electronic part 2 and substrate 5 are bonded and secured via insulating resin 8. Here, though protective film 4 is formed on the surface of electronic part 2 in FIG. 1, it is not necessary to provide protective film 4.

In addition, in the present exemplary embodiment, a case where a bare chip semiconductor element is used as electronic part 2 is described as an example, and this is in some cases referred to as electronic part 2 or semiconductor element 2.

In the above electronic part mounting structure 1, protruding electrodes 7 are in truncated conical form and made of a conductive resin, and protruding electrodes 7 and connection terminals 6 are electrically connected through contact. As a result, flexible protruding electrodes absorb stress resulting from thermal impact or mechanical impact, and an electronic part mounting structure where connection defects are difficult to be caused and which is highly reliable can be obtained. In addition, protruding electrodes having a fine diameter and a great height, that is to say, a large aspect ratio, can be easily formed, and therefore, connection where warps of the semiconductor element or the substrate are absorbed can be achieved with a low load. As a result, an electronic part mounting structure where there is little fluctuation in the properties can be realized even on a semiconductor element having an insulating film with a low dielectric constant and low mechanical strength without damaging the semiconductor element.

Hereinafter, the manufacturing method for the electronic part mounting structure according to the first exemplary embodiment of the present invention is described.

First, protruding electrodes 7 made of a conductive resin including a photosensitive resin which is sensitive to visible light and a conductive filler are formed on electrode terminals 3 of electronic part 2 or on connection terminals 6 of substrate 5. At this time, the apex of protruding electrodes 7 may be provided with a thermoplastic or thermosetting conductive adhesive through transfer method. Here, in the present exemplary embodiment, an example where the protruding electrodes are formed on electrode terminals 3 of electronic part 2 is described.

Next, connection terminals 6 of substrate 5 and electrode terminals 3 of electronic part 2 are positioned with protruding electrodes 7 of electronic part 2 formed on electrode terminals 3 interposed therebetween. Here, insulating resin 8 is formed on the surface of substrate 5 where connection terminals 6 are formed before being positioned. Here, insulating resin 8 is formed in accordance with a screen printing method or a dispensing method, for example.

Next, electronic part 2 is pressed so that electrode terminals 3 of electronic part 2 and connection terminals 6 of substrate 5 are pressed and connected each other with protruding electrodes 7 interposed therebetween. At this time, insulating resin 8 is removed from the interface between connection terminals 6 and protruding electrodes 7, when electronic part 2 is pressed, and finally, protruding electrodes 7 and connection terminals 6 make contact so as to be electrically connected.

Next, insulating resin 8 is heated and cured in the above state. As a result, electronic part 2 and substrate 5 are bonded and secured to each other. Electronic part mounting structure 1 is fabricated through the above steps.

Here, though an example where insulating resin 8 is formed on substrate 5 in advance is described in the present exemplary embodiment, the invention is not limited to this. For example, electronic part 2 and substrate 5 may be positioned and pressed each other to connect protruding electrodes 7 and connection terminals 6, and then insulating resin 8 may be filled between electronic part 2 and substrate 5. At this time, an anisotropic conductive adhesive may be used instead of insulating resin 8.

Hereinafter, the manufacturing method for protruding electrodes 7, which are important components of the present exemplary embodiment, is described in reference to FIGS. 2A and 2B.

Figure 2A:
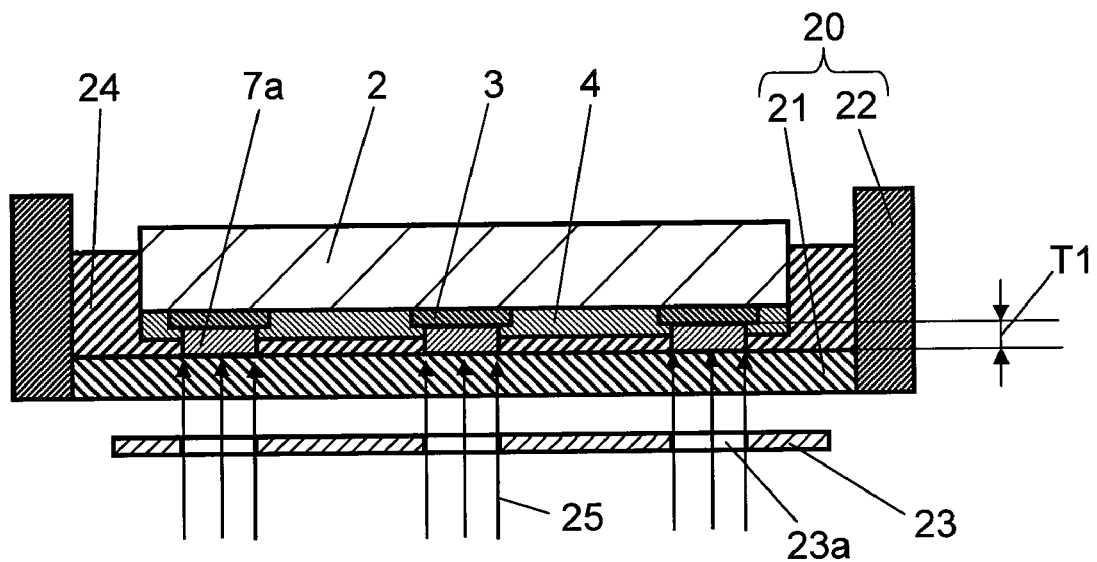
FIG. 2A is a cross sectional diagram illustrating the step of forming a first layer of protruding electrodes in the manufacturing method for the electronic part mounting structure according to the first exemplary embodiment.
Figure 2B:
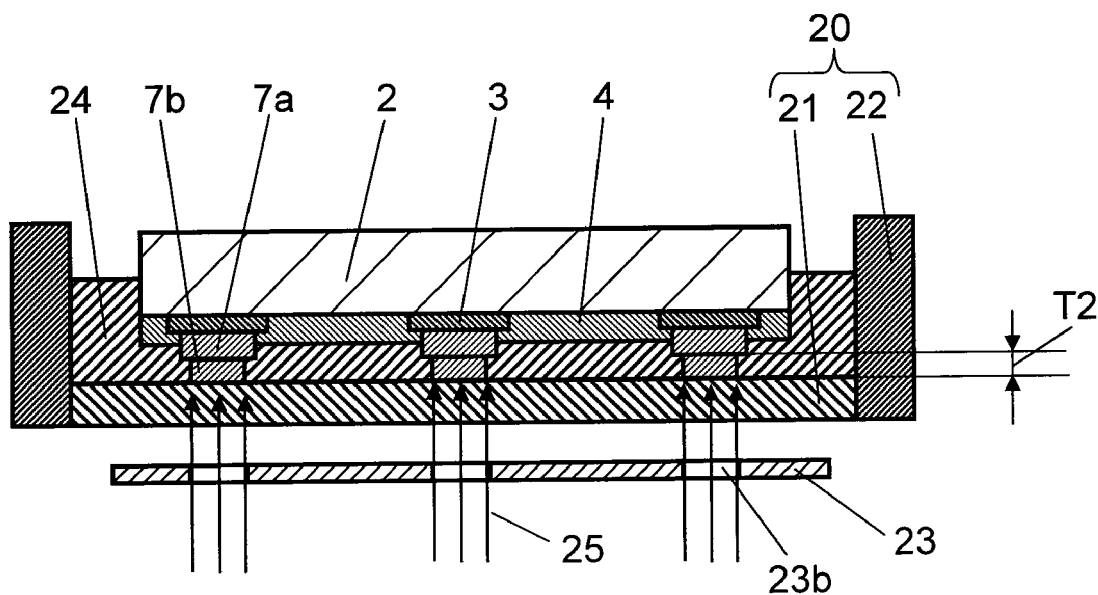
FIG. 2B is a cross sectional diagram illustrating the step of forming a second layer of protruding electrodes in the manufacturing method for the electronic part mounting structure according to the first exemplary embodiment.

FIGS. 2A and 2B are cross sectional diagrams illustrating the main steps in the manufacturing method for protruding electrodes 7, FIG. 2A is a cross sectional diagram illustrating the step of forming first layer 7a of protruding electrodes 7, and FIG. 2B is a cross sectional diagram illustrating the step of forming second layer 7b of protruding electrodes 7.

First, as shown in FIG. 2A, liquid resin 24 including a photosensitive resin which is sensitive to visible light and a conductive filler is fed to container 20 until at least electrode terminals 3 of electronic part 2 is immersed. Here, liquid resin 24 is a conductive resin in a state where the photosensitive resin is uncured, and is in some cases simply referred to as conductive resin. In addition, container 20 is integrally formed of outer periphery portion 22 and bottom portion 21 made of a transparent member, such as crystal or polyethylene terephthalate or the like, through which visible light for curing liquid resin 24 transmits. At this time, an acrylate based photosensitive resin of which the peak sensitivity is adjusted to 430 nm, for example, is used as liquid resin 24. In addition, silver particles, gold particles or solder particles are used as the conductive filler. Concretely, liquid resin 24 where 60% by weight of silver particles in spherical form having an average particle diameter of 3 μm, 5% by weight of silver particles in spherical form having an average particle diameter of 0.3 μm, 25% by weight of silver particles in scale form having an average particle diameter of 3 μm and 10% by weight of a photosensitive resin are blended is used. Here, it is preferable to carry out a water repellent process on the transparent member of bottom portion 21.

Next, as shown in FIG. 2A, distance T1 between electrode terminals 3, which are 100 μm squares formed on the main surface of electronic part 2 made of, for example, a 6 mm square semiconductor element, and which are made of, for example, Al or Au, with a pitch of 150 μm, and bottom portion 21 is set to the same thickness as first layer 7a of protruding electrodes 7, for example 5 μm. At this time, photo mask 23, for example a liquid crystal panel or the like, is placed beneath bottom portion 21, and first openings 23a for forming first layer 7a of protruding electrodes 7 are provided in photo mask 23 as, for example, 80 μm squares. In addition, liquid resin 24 is irradiated with visible light 25 from bottom portion 21 through first openings 23a in photo mask 23. As a result, liquid resin 24 located between electrode terminals 3 and bottom portion 21 is cured, and first layer 7a of protruding electrodes 7, which is an 80 μm square having a height of 5 μm, is formed.

Next, as shown in FIG. 2B, electronic part 2 is pulled up and the distance T2 between first layer 7a of protruding electrodes 7 and bottom portion 21 is set to the same thickness as second layer 7b of protruding electrodes 7, for example 5 μm. Then, same as in FIG. 2A, liquid resin 24 is irradiated with visible light 25 from bottom portion 21 through photo mask 23. At this time, second openings 23b which are smaller than first openings 23a are provided as, for example, 60 μm squares in photo mask 23. As a result, liquid resin 24 is cured between first layer 7a and bottom portion 21, so that second layer 7b of protruding electrodes 7, which is a 60 μm square having a height of 5 μm, is formed.

Next, the steps in FIGS. 2A and 2B are repeated, that is, the electronic part is pulled up by a predetermined distance (for example 5 μm) and a light exposure process is carried out, and thus, third layer 7c, which is, for example, a 40 μm square having a height of 5 μm, and fourth layer 7d, which is, for example, a 20 µm square having a height of 5 µm, are formed, and protruding electrodes 7 made of four layers, as shown in FIG. 1, having a height of 20 µm are fabricated.

Next, electronic part 2 is taken out from container 20, and after that cleaned through, for example, ultrasonic cleaning or the like, so that unnecessary liquid resin is removed, and thus, a semiconductor element which is electronic part 2, where protruding electrodes 7 are formed, is fabricated. At this time, the inconsistency in the height of protruding electrodes 7 is controlled by the degree to which the semiconductor element and the bottom surface of bottom portion 21 are parallel, and in a case where the parallelism is 2 µm, for example, the inconsistency in the height is within 2 µm.

In the above steps, the electronic part is pulled up by a predetermined distance sequentially, and the liquid resin is irradiated with visible light using photo masks with openings which gradually become smaller, and thus, protruding electrodes 7 in truncated conical form can be formed on electrode terminals 3 of electronic part 2.

Here, in the present exemplary embodiment, a transmission type liquid crystal panel where liquid crystal cells (not shown) are two-dimensionally provided is used as photo mask 23, and the size of first openings 23a and second openings 23b is electrically controlled by means of the voltage applied to the liquid crystal cell. In addition, a liquid crystal panel is used as photo mask 23, and protruding electrodes may be formed in accordance with a scale-down projection light exposure method where the image of light that transmits through this liquid crystal panel is scale-down projected to irradiate liquid resin 24.

In addition, in the present exemplary embodiment, though an example where bottom portion 21 of container 20 is a transparent member is described, the invention is not limited thereto. For example, bottom portion 21 of container 20 may be a photo mask. As a result, visible light can be prevented from being scattered by the transparent member, and a finer pattern can be formed with high precision.

Hereinafter, conductive resins which can be used in the present exemplary embodiment are described in detail.

Conductive resins contain a photosensitive resin and a conductive filler. In addition, photosensitive resins include at least a photo-curing monomer, a photo-curing oligomer and a photopolymerization initiator. Here, it is preferable that the photo-curing monomer includes both a multifunctional monomer having a plurality of photopolymeric groups and a monofunctional monomer having only one photopolymerization group.

Here, as the multifunctional monomer having a plurality of photopolymeric groups, a compound having two or more functional groups which makes polymerization possible, such as double-bonded carbon, in a molecule, for example, is used. It is preferable that a plurality of functional groups which make polymerization possible and are included in a multifunctional monomer is 3 to 10, but it is not limited to the above range. Here, in a case where a plurality of functional groups which make polymerization possible is less than 3, the curing properties of the conductive resin tend to lower. In a case where a plurality of functional groups exceeds 10, the size of molecules becomes great, and the viscosity of the conductive resin tends to be great.

Specific examples of the multifunctional monomer having a plurality of photopolymeric groups include allylated cyclohexyl diacrylate, 1,4-butanediol diacrylate, 1,3-butylene glycol diacrylate, 1,6-hexanediol diacrylate, ethylene glycol diacrylate, diethylene glycol diacrylate, triethylene glycol diacrylate, polyethylene glycol diacrylate, pentaerythritol triacrylate, pentaerythritol tetraacrylate, dipentaerythritol pentaacrylate, dipentaerythritol hexaacrylate, dipentaerythritol monohydroxy pentaacrylate, ditrimethylolpropane tetraacrylate, glycerol diacrylate, methoxy cyclohexyl diacrylate, neopentil glycol diacrylate, propylene glycol diacrylate, polypropylene glycol diacrylate, triglycerol diacrylate, trimethylolpropane triacrylate, bisphenol A diacrylate, bisphenol A-ethylene oxide adduct diacrylate and bisphenol A-propylene oxide adduct diacrylate. In addition, compounds where a part of or the entirety of the acryl groups included in the above compounds are substituted with, for example, a methacryl group can be used.

A monofunctional monomer having only one photopolymeric group is added to the conductive resin in order to prevent a fogging phenomenon. That is to say, in a case where no monofunctional monomer is contained, photocuring easily progresses, and therefore, photocuring progresses not only in the portions which are exposed, but also to portions which are not exposed. Therefore, the fogging phenomenon where the border in the pattern becomes unclear is easy to occur.

In addition, monofunctional monomers have a relatively low viscosity. A monofunctional monomer may be added to the conductive resin in order to lower the viscosity.

The monofunctional monomer having only one photopolymeric group includes benzyl acrylate, butoxyethyl acrylate, butoxytriethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isobonyl acrylate, 2-hydroxypropyl acrylate, isodexyl acrylate, isooctil acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate and trifluoroethyl acrylate. In addition, compounds where the acryl groups included in the above compounds are substituted with, for example, a methacryl group can be used as the monofunctional monomer.

As the photopolymerization initiator, an appropriate commercially available initiator can be used. As the photopolymerization initiator, a combination of a photo-reducing coloring matter and a reducing agent, for example, can be used. Here, the photopolymerization initiator is not limited thereto.

The photo-reducing coloring matter includes, benzophenone, o-benzoyl methylbenzoate, 4,4'-bis(dimethylamine) benzophenone, 4,4'-bis(diethylamine) benzophenone, α-aminoacetophenone, 4,4'-dicholrobenzophenone, 4-benzoyl-4'-methyldiphenyl ketone, dibenzyl ketone, fluorenone, 2,2-diethoxyacetophenone, 2,2-dimethoxy-2-phenylacetophenone, 2-hydroxy-2-methylpropylphenone, p-tert-butyldichloroacetophenone, thioxanton, 2-methylthioxanton, 2-chlorothioxanton, 2-isopropylthioxanton, diethylthioxanton, benzyldimethyl ketal, benzyl methoxy ethyl acetal, benzoin methylether, anthraquinone, 2-tert-butyl anthraquinone, 2-amyl anthraquinone, β-chloroanthraquinone, anthrone, benzanthrone, dibenzsuberone, methylene anthrone, 4-azidobenzyl acetophenone, 2,6-bis(p-azidobenzylidene)-4-methylcyclohexanone, 2-phenyl-1,2-butadione-2-(O-methoxycarbonyl)oxime, 1-phenyl-propanedion-2-(O-ethoxycarbonyl)oxime, 1,3-diphenyl-propanetrion-2-(O-ethoxycarbonyl)oxime, 1-phenyl-3-ethoxy-propanetrion-2-(O-benzoyl)oxime, Michler's ketone, 2-methyl-1-[4-(methylthio)phenyl]-2-morpholinopropane-1-on, 2-benzyl-2-dimethyl aminol-1-(4-morpholinophenyl)-butanone-1, naphthalene, sulfonyl chloride, quinoline sulfonyl chloride, n-phenylthioacrydone, 2,2'-azobisisobutylol nitrile, diphenyl sulfide, benzthiazole disulfide, triphenylphosphene, camphorquinone, carbon tetrabromide, tribromophenyl sulfone, benzoyl peroxide, eosine and methylene blue. They may be used alone or in combination of two or more kinds.

The reducing agent includes ascorbic acid and triethynol amine. They may be used alone or in combination of two or more kinds.

In addition, the photosensitive resin may include a solvent which dissolves the above substances in addition to a photocuring monomer and a photopolymerization initiator.

As the conductive filler, fine metal particles having conductivity are preferable. Fine particles of gold, platinum, nickel, copper, palladium, molybdenum, tungsten or the like can be exemplified. These fine metal particles may be used solely or in a state of coating the surface of a resin, or in combination of two or more kinds. In addition, an alloy powder made of an alloy which includes one of the above elements can be used as the conductive filler.

In addition, it is appropriate to use a metal material having a relatively low melting point and a low resistivity value as the conductive filler for the purpose of obtaining a conductor with a low resistance through heat treatment at a low temperature. As for such a metal material, gold, silver and copper, for example, are preferable. Here, among them, silver is the most preferable. This is because gold is too expensive and copper is easily oxidized in comparison with silver, and therefore, heat treatment may not be able to be carried out in the air. Furthermore, in a case where silver is used, it is known that particles of which the average particle diameter is 3 μm or less are easily sintered through calcining at 150° C. to 300° C. and the resistance of the conductors using the particles is low. In addition, in a case where a conductor contains 85% by weight of silver particles of which the diameter is 0.3 μm or 1.8 μm and is calcined at 200° C. to 300° C. for one hour, a resistivity in the order of $10^{-5}$ Ω·cm to $10^{-6}$ Ω·cm is obtained.

The conductive filler may be in fine crystal form (fine particle form), in particle form or amorphous. Here, particle form includes bulk form, scale form, spherical form and flake form. Among them, a spherical form is preferable as the form of the conductive filler. This is because light transmittance is excellent when exposed and the efficiency of light exposure is excellent.

It is preferable that the average particle diameter of the conductive filler is to be 1 μm to 5 μm, and it is more preferable to be 1.5 μm to 3 μm. In a case where the average particle diameter of the conductive filler is too small, the reflection of light is weak and the region through which light passes is small. Therefore, the depth to which the resin is cured is small. Meanwhile, when the average particle diameter is too great, the conductive filler tends to easily precipitate due to its own weight, and thus, light is shielded.

It is preferable that the amount of the conductive filler is to be 45% by weight to 90% by weight of the liquid resin in order to obtain protruding electrodes having a low resistance value. In particular, in a case where the portion of the photosensitive resin which is not cross-linked and the volatile component of the solvent or the like are evaporated through heating, it is preferable that the amount of the conductive filler is to be 45% by weight to 75% by weight. In addition, in a case where there is no evaporation, it is more preferable to be 80% by weight to 90% by weight. Here, in a case where the amount of the conductive filler is less than 45% by weight, the obtained protruding electrodes have a high resistance. In the case where the amount of the conductive filler exceeds 90% by weight, the height (thickness) of the formed protruding electrodes is low.

It is preferable that the viscosity of the conductive resin is to be 1 Pa·s to 50 Pa·s and more preferable 20 Pa·s or less in order that the gap between the electronic part and the substrate is successfully filled with the conductive resin. In particular, in a case where the viscosity of the conductive resin is less than 1 Pa·s, the thickness of the conductive resin can be reduced since the gap between the electronic part and the substrate is more successfully filled in with the conductive resin. Furthermore, the filling time can be shortened, and therefore, productivity can be increased. Meanwhile, in the case where the viscosity of the conductive resin exceeds 50 Pa·s, more time may be required for filling in order to form a conductive resin with a predetermined thickness or air may be mixed in the gap. Furthermore, in some cases, filling becomes difficult and the conductive resin cannot be interposed between the electronic part and the substrate.

The viscosity can be measured at, for example, a temperature of 25° C. using a cone plate type viscometer.

Here, the viscosity of the conventionally used conductive resins (for screen printing) is approximately 50 Pa·s to 100 Pa·s.

In the photosensitive resin included in the conductive resin, though the mixing amounts of the multifunctional monomer, the monofunctional monomer and the photopolymerization initiator depends on the types of the monomer, the initiator and the like, it is preferable that the multifunctional monomer is to be, for example, 5 parts by weight to 30 parts by weight, the monofunctional monomer is to be 0.5 part by weight to 10 parts by weight, and the photopolymerization initiator is to be 0.1 part by weight to 5 parts by weight relative to 100 parts by weight of the conductive filler. In a case where the amount of each component deviates from the range, a desired conductivity, for example, may not be obtained, and a problem may arise in the adhesiveness or the formation of the protruding electrodes.

It is preferable that the time during which photocuring of the liquid resin completes is to be short (for example, within about 10 minutes). It is preferable that the liquid resin is to be preserved while being stirred within a predetermined container before it makes contact with the surface to be exposed. In addition, in a case where the protruding electrodes are formed on a metal, such as the electrode terminals, an adhesion additive such as a coupling agent or complex ions may be added.

The protruding electrodes obtained by curing this liquid resin include a conductive filler of which the amount is within the above range, and therefore, heat treatment can be carried out at 150° C. to 350° C., and in a case where the included conductive filler is gold particles or silver particles and the average particle diameter thereof is several nm to several hundreds of nm, heat treatment can be carried out at 150° C. to 250° C.

Here, the liquid resin may include, for example, a dispersing agent and a viscosity adjusting agent in addition to the conductive filler and the photosensitive resin. In a case where this liquid resin includes a dispersing agent, it is preferable that the amount of the dispersing agent is to be 1% by weight to 5% by weight of the liquid resin. In the case where the amount of the dispersing agent is too small, the conductive filler does not disperse uniformly and the inconsistency in the height or the form of the protruding electrodes becomes great. In the case where the amount of the dispersing agent is too much, the conductivity of the obtained protruding electrodes is negatively affected.

Hereinafter, another example of the manufacturing method for the electronic part mounting structure according to the first exemplary embodiment of the present invention is described in reference to FIGS. 3A and 3B.

Figure 3A:
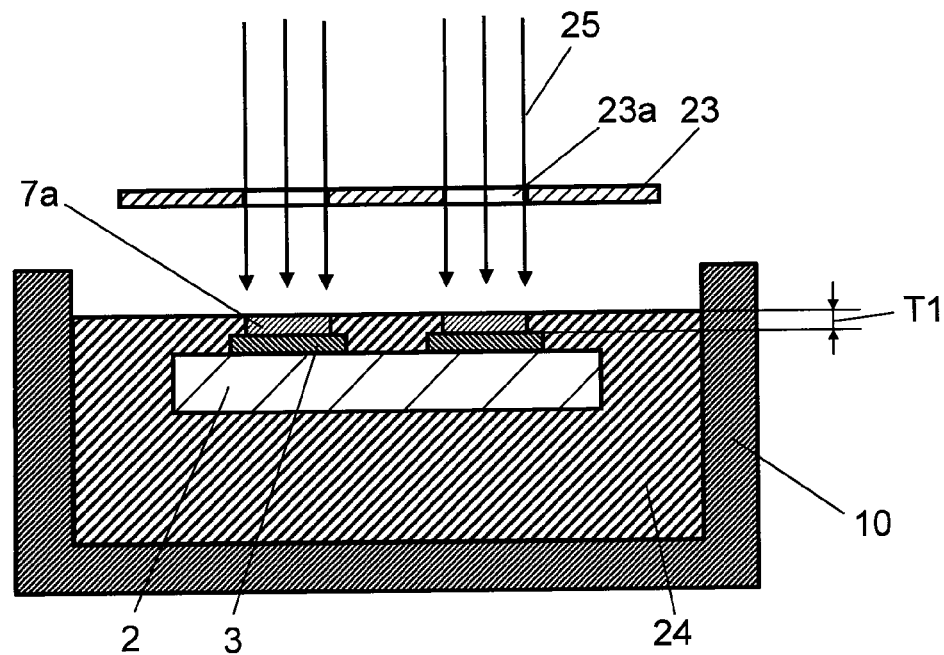
FIG. 3A is a cross sectional diagram illustrating the method for forming a first layer of protruding electrodes in another example of the manufacturing method for the electronic part mounting structure according to the first exemplary embodiment.

FIG. 3A is a cross sectional diagram illustrating the method for forming first layer 7a of protruding electrodes 7, and FIG.

3B is a cross sectional diagram illustrating the method for forming second layer 7b of protruding electrodes 7.

Figure 3B:
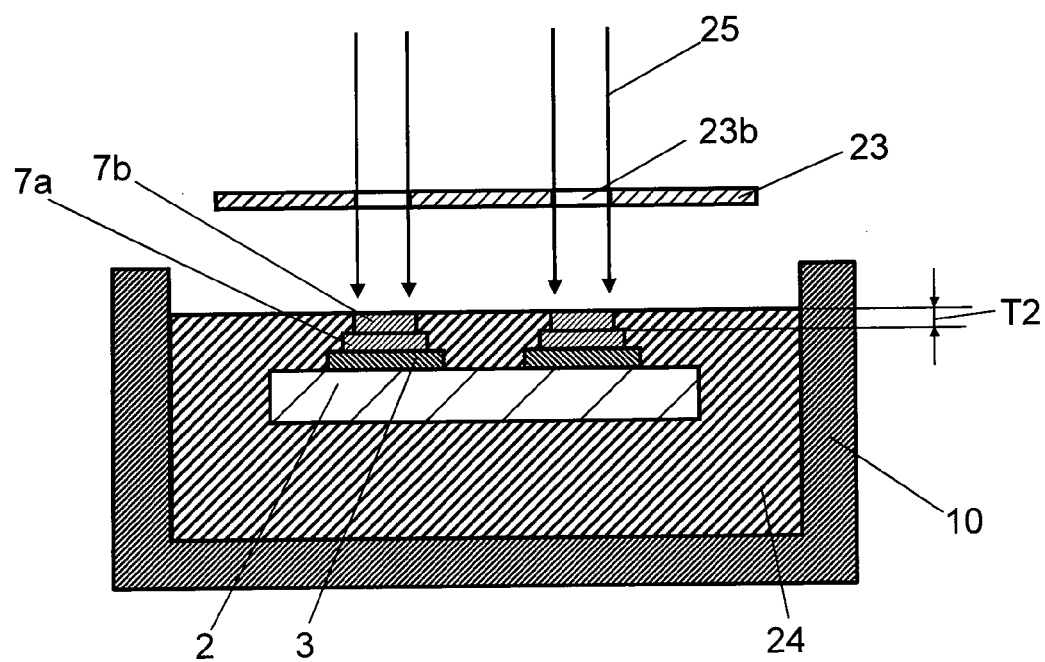
FIG. 3B is a cross sectional diagram illustrating the method for forming a second layer of protruding electrodes in another example of the manufacturing method for the electronic part mounting structure according to the first exemplary embodiment.

The manufacturing method for protruding electrodes 7 shown in FIGS. 3A and 3B is basically the same as the manufacturing method shown in FIGS. 2A and 2B, but it is different in that the protruding electrodes having a layer structure are formed while electronic part 2 is being immersed into the liquid resin. Here, FIGS. 3A and 3B illustrate a configuration where electronic part 2 has two electrode terminals 3 and protective film 4 is not formed, but the invention is not limited thereto.

First, as shown in FIG. 3A, electronic part 2 is immersed into liquid resin 24 in container 10 with the surface where electrode terminals 3 are formed facing upward. At this time, distance T1 between electrode terminals 3 formed on the surface of electronic part 2 and the surface of liquid resin 24 is set to the thickness of first layer 7a of protruding electrodes 7 when electronic part 2 is immersed. At this time, the surface of liquid resin 24 may be made uniform with a coater or the like in order to make the thickness of T1 constant.

Then, liquid resin 24 is irradiated with visible light 25 via first opening 23a of photo mask 23. As a result, liquid resin 24 on the surface of electrode terminals 3 is cured so that first layer 7a of protruding electrodes 7 is formed.

Next, as shown in FIG. 3B, electronic part 2 is immersed more deeply, and distance T2 between first layer 7a of protruding electrodes 7 and the surface of liquid resin 24 is set to the thickness of second layer 7b of protruding electrodes 7. Then, same as in FIG. 3A, liquid resin 24 is irradiated with visible light 25 via photo mask 23. At this time, photo mask 23 is provided with second openings 23b which are smaller than first openings 23a. As a result, liquid resin 24 on the surface of first layer 7a is cured, so that second layer 7b of protruding electrodes 7 is formed. Here, as photo mask 23, a transmission type liquid crystal panel is used, same as in the first exemplary embodiment.

Next, the steps in FIGS. 3A and 3B are repeated, and third layer 7c and fourth layer 7d are formed by immersing the electronic part into the liquid resin by a predetermined distance and through the process for exposure, and thus, protruding electrodes 7 having four layers, as shown in FIG. 1, are fabricated.

Next, electronic part 2 is taken out from container 10 and cleaned, so that unnecessary liquid resin is removed, and thus, the semiconductor element which is electronic part 2 on which protruding electrodes 7 are formed, is fabricated.

In the above steps, for example, photo masks 23 with gradually smaller openings are used while electronic part 2 is immersed sequentially by a predetermined distance to irradiate with visible light 25, and thus, protruding electrodes 7 in truncated conical form can be formed on electrode terminals 3 of electronic part 2.

Figure 4A:
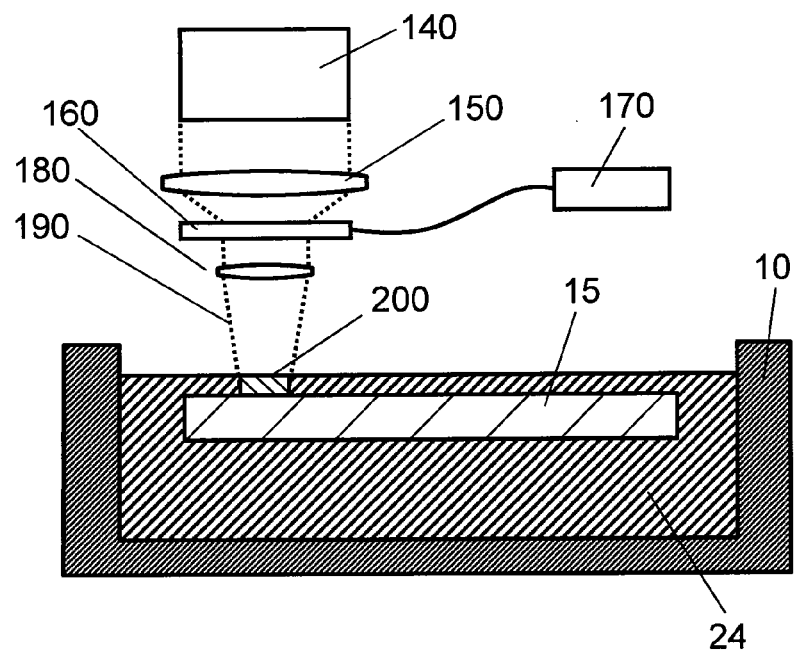
FIG. 4A is a schematic diagram showing the entire configuration illustrating a method for forming protruding electrodes in accordance with a scale-down projection light exposure method in the manufacturing method for the electronic part mounting structure according to the first exemplary embodiment.
Figure 4B:
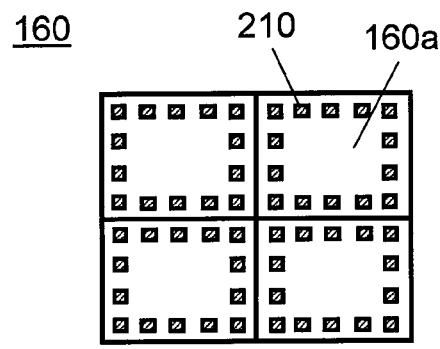
FIG. 4B is a plan diagram schematically showing the form of the photo mask used in the scale-down projection light exposure method in FIG. 4A
Figure 4C:
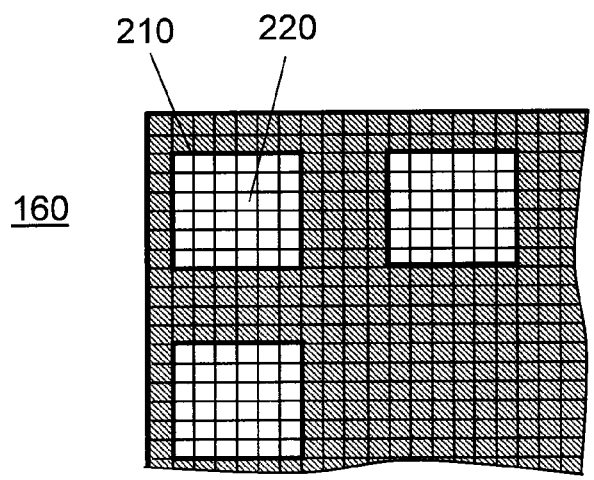
FIG. 4C is a plan diagram showing a detailed portion of the photo mask in FIG. 4B.

Here, in the present exemplary embodiment, though examples where protruding electrodes are formed on an individual electronic part are described, the invention is not limited thereto. In a case where the electronic part is a semiconductor element for example, protruding electrodes 7 may be formed on a semiconductor wafer where a plurality of semiconductor elements are formed on a silicon substrate using a scale-down projection light exposure method, as shown in FIGS. 4A to 4C. At this time, protruding electrodes may be connected and short-circuited due to surplus growth caused by scattered light which leaks from the periphery of the openings of the photo mask in a case where the pitch of the protruding electrodes 7 is as small as 150 μm, for example. In such cases, the gray scale of the liquid crystal panel can be used to obtain sharp protruding electrodes.

Thus, a method for forming protruding electrodes in accordance with a scale-down projection light exposure method is described hereinafter. FIG. 4A is a schematic diagram showing the configuration of the entirety, FIG. 4B is a schematic plan diagram showing the form of the photo mask used in accordance with the scale-down projection light exposure method, and FIG. 4C is a plan diagram showing a portion of the photo mask in FIG. 4B in detail. Here, FIG. 4B shows an example of a photo mask where protruding electrodes for four semiconductor elements are formed at once on liquid crystal panel 160, and mask region 160a in the photo mask corresponding to one semiconductor element of liquid crystal panel 160 is provided with a plurality of openings 210 for forming protruding electrodes. In addition, openings 210 are formed so as to correspond to the electrode terminals of the semiconductor element provided in the outer periphery region. In addition, as shown in FIG. 4C, openings 210 formed of liquid crystal panel 160 are composed of 36 pieces of liquid crystal cells 220, for example.

As shown in FIG. 4A, container 10 is filled with liquid resin 24. In addition, semiconductor wafer 15 on which a large number of semiconductor elements are formed is immersed in the container 10. At this time, light source 140, optical system 150 and liquid crystal panel 160, which is used as the photo mask, and scale-down projection optical system 180 are provided above container 10. In this case, openings in liquid crystal panel 160 are controlled by liquid crystal panel control apparatus 170, and as a result, the shape of the openings can be set in a relatively wide range. In addition, semiconductor wafer 15 is irradiated with visible light 190, which is emitted from light source 140 and passes through optical system 150, liquid crystal panel 160 and scale-down projection optical system 180. At this time, the pattern formed on liquid crystal panel 160 is scaled down using the scale-down optical projection system 180 before being projected onto semiconductor wafer 15. As a result, liquid resin 24 in region 200 irradiated with visible light 190 within region 200 corresponding to four semiconductor elements, for example, is cured in the pattern of liquid crystal panel 160 which is scale-down projected to form protruding electrodes.

Concretely, first, as shown in FIG. 4C, one openings 210 is formed with 36 pieces of liquid crystal cells 220, and these openings are aligned as shown in FIG. 4B and irradiated with visible light 190. The first layer of the protruding electrodes is formed on the electrode terminals of four semiconductor elements through irradiation with visible light 190.

Next, the semiconductor wafer or the scale-down light exposure apparatus is moved by every four semiconductor elements, and four semiconductor elements are exposed, as in the above. Then, the operation is repeated, so that the entire surface of semiconductor wafer 15 is exposed, and thus, the first layer of the protruding electrodes is formed on the electrode terminals of the respective semiconductor elements in semiconductor wafer 15.

Next, semiconductor wafer 15 is immersed more deeply into liquid resin 24 by a predetermined distance. Then, four semiconductor elements are exposed sequentially, as in the above, and the second layer of the protruding electrodes is formed. At this time, liquid crystal cell 220 is driven, so that four semiconductor elements are exposed through smaller openings than for the first layer, for example. That is to say, the openings for the first layer are formed using 36 pieces of liquid crystal cells 220, and the openings for the second layer are formed using 16 pieces of liquid crystal cells, and thus, protruding electrodes in truncated, pyramid form, for example, can be formed.

Here, in the above, though examples are described where the first layer of the protruding electrodes is formed on the entirety of the semiconductor wafer and after that the second layer is formed thereon so that the protruding electrodes are completed, the invention is not limited thereto. For example, protruding electrodes are completed for every four semiconductor elements, so that the protruding electrodes are formed on the entirety of the semiconductor wafer sequentially.

Here, in the present exemplary embodiment, though examples where protruding electrodes in truncated conical form or truncated, pyramid form are formed are described, the invention is not limited thereto. The protruding electrodes may be in truncated, pyramid form, columnar form, prism form, conical form, pyramid form or cylindrical form, for example. Furthermore, in the present exemplary embodiment, though examples where the protruding electrodes are formed of a plurality of layers and each layer gradually become smaller in the configuration are described, the invention is not limited thereto. For example, a plurality of layers may have the same form, and furthermore, any form can be provided such as a configuration where each layer may gradually become larger. The form and configuration of the protruding electrodes can be easily changed by controlling the openings of the described photo mask.

In addition, in the present exemplary embodiment, though examples where the protruding electrodes are made of a conductive resin are described, the invention is not limited thereto. A conductive coating of, such as nickel, copper, tin or gold may be formed on the surface of the protruding electrodes through electroless plating or the like. Furthermore, a resist film is formed on the protective film, and a conductive thin film is formed through vapor deposition or sputtering, and then, the resist film is removed and a conductive coating film may be formed on the surface of the protruding electrodes. As a result, the contact resistance between the electrode terminals and the connection terminals through the protruding electrodes can be made small.

Second Exemplary Embodiment

Figure 5:
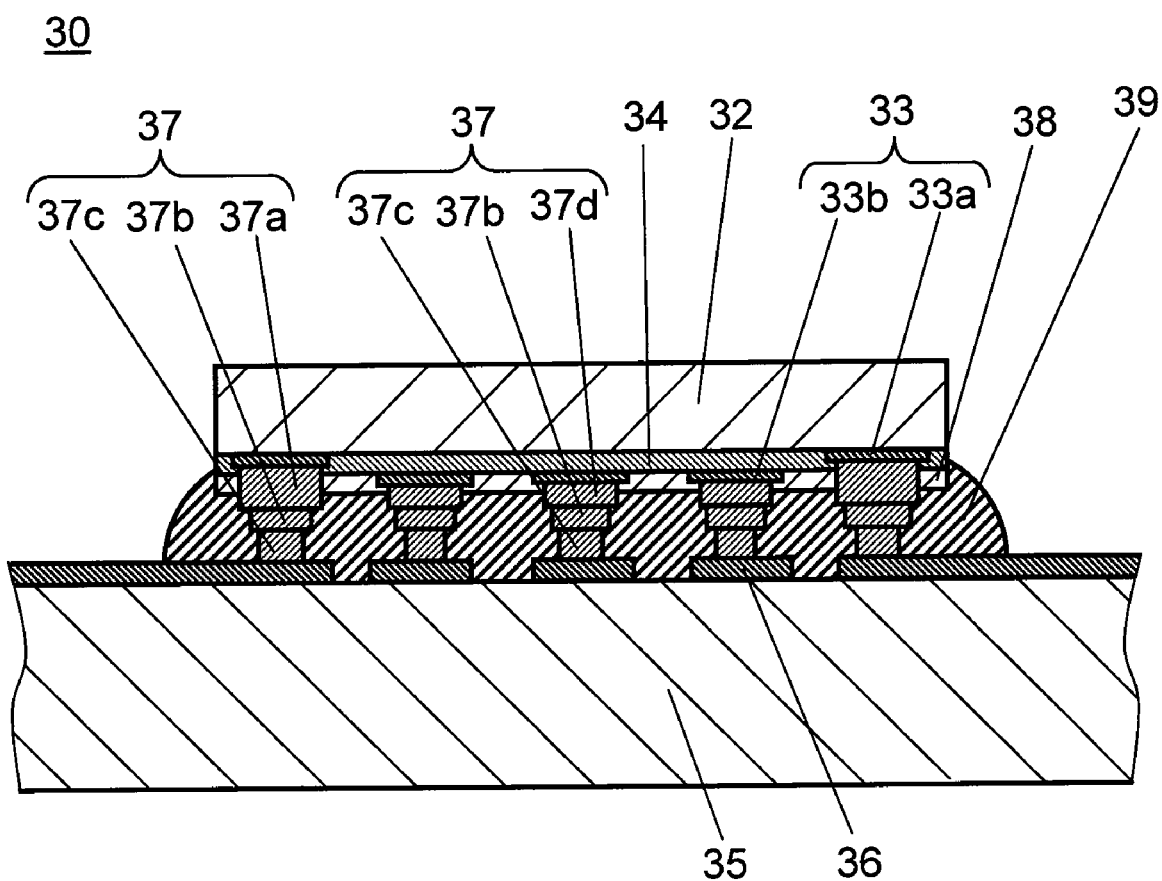
FIG. 5 is a cross sectional diagram showing the configuration of the electronic part mounting structure according to a second exemplary embodiment of the present invention.

FIG. 5 is a cross sectional diagram showing the configuration of electronic part mounting structure 30 according to the second exemplary embodiment of the present invention. As shown in FIG. 5, electronic part mounting structure 30 according to the present exemplary embodiment is different from the first exemplary embodiment in that the thickness of the first layer which makes contact with electrode terminals 33 among a plurality of layers that form protruding electrodes 37 is different depending on the location where electrode terminals 33 are placed. The another configuration is the same as in the electronic part mounting structure according to the first exemplary embodiment, and therefore, description thereof is not given in some cases.

That is to say, as shown in FIG. 5, electronic part mounting structure 30 is provided with electronic part 32 having a plurality of electrode terminals 33, substrate 35 provided with connection terminals 36 in locations corresponding to electrode terminals 33, and protruding electrodes 37 for connecting electrode terminals 33 and connection terminals 36. In addition, protruding electrodes 37 are formed of a photosensitive resin which is sensitive to visible light and a conductive resin which includes a conductive filler.

Hereinafter, a case where a bare chip semiconductor element is used as electronic part 32 is described as an example, and the bare chip semiconductor element may be referred to as electronic part 32 or semiconductor element 32.

In addition, in the present exemplary embodiment, protruding electrodes 37 are in truncated conical form and are formed of three layers in the height (thickness) direction, and first layer 37a and 37d, second layer 37b and third layer 37c are formed of the same material. In addition, the thickness of first layer 37a and 37b is different depending on the location where the electrode terminals of the electronic part are placed. That is to say, electrode terminals 33 of electronic part 32 include two types: lower stage side electrode terminals 33a, which are formed directly on the surface where pads of a single crystal silicon base are formed (not shown), and upper stage side electrode terminals, which are formed on first protective film 34, and the thickness of first protective film 34 becomes the difference in the height of the first layer. In addition, the thickness of first layer 37a formed on lower stage side electrode terminals 33a is greater than the thickness of first layer 37d formed on upper stage side electrode terminals 33b, and the location on the surface of first layer 37a and first layer 37d is in the same plane.

Furthermore, the thickness of second layer 37b and third layer 37c formed on first layer 37a and 37d is the same, and thus, the location on the surface of the protruding electrodes is in the same plane, though, the height of electrode terminals 33 is different between the respective locations where they are placed.

Here, in the present exemplary embodiment, though second protective film 38 is formed so as to surround lower stage side electrode terminals 33a and upper stage side electrode terminals 33b, it is not necessary to form second protective film 38. In addition, lower stage side electrode terminals 33a and upper stage side electrode terminals 33b are connected to the circuits on the circuit forming surface through wires, not shown.

In the present exemplary embodiment, electronic part 32 and substrate 35 can be connected with a small pressing force through protruding electrodes 37 which are formed in the same plane with no inconsistency in the height. Therefore, the circuit on the circuit forming surface of the electronic part can be prevented from being damaged as a result of the pressing force, even in a case where electrode terminals are provided on the circuit forming surface, for example. In particular, the electronic part can be mounted with high reliability, without damaging the insulating film, even in a case where a dielectric material having low mechanical strength and a low dielectric constant, such as SiOC, is used in order to deal with miniaturization of the wiring pattern of the semiconductor element.

In addition, protruding electrodes 37 are in truncated conical form and made of a flexible conductive resin, and in addition, protruding electrodes 37 and connection terminals 36 are electrically connected through contact. Therefore, stress caused by thermal impact or mechanical impact is absorbed by the flexible protruding electrodes, and thus, an electronic part mounting structure where it is difficult that connection defect is caused and which is highly reliable can be obtained. In addition, electrode terminals which are placed at different heights and connection terminals can be connected without failure, and at the same time, protruding electrodes having a fine diameter and a high aspect ratio can be easily formed, and therefore, warps in the semiconductor elements or the substrate are absorbed, and connection can be achieved with a low load of 1 gf to 5 gf per protruding electrode, for example.

Hereinafter, the manufacturing method for the electronic part mounting structure according to the exemplary embodiment of the present invention is described.

First, protruding electrodes 37 made of a conductive resin that includes a photosensitive resin which is sensitive to visible light and a conductive filler are formed on electrode terminals 33 of electronic part 32. Here, in the present exemplary embodiment, though an example where the protruding electrodes are formed on electrode terminals 33 of electronic part 32 is described, they may be formed on connection terminals 36 of substrate 35.

Next, connection terminals 36 on substrate 35 and electrode terminals 33 on electronic part 32 are positioned via protruding electrodes 37 of electronic part 32, which are formed on electrode terminals 33. Here, before positioning, insulating resin 39 is formed on the surface of substrate 35 where connection terminals 36 are formed.

Next, electronic part 32 is pressed, so that electrode terminals 33 of electronic part 32 and connection terminals 36 of substrate 35 are pressed each other to be connected via protruding electrodes 37. At this time, insulating resin 39 is removed from the interface between the connection terminals 36 and the protruding electrodes 37 as a result of the pressure of electronic part 32, and finally, protruding electrodes 37 and connection terminals 36 make contact with each other to be electrically connected. Here, pressure may be applied for the connection while heat is applied. When heat is applied, protrusion electrodes 37 become soft (the elasticity is reduced), so that connection through pressure under a low load becomes possible. In addition, the cross linking reaction of insulating resin 39 also starts, and therefore, insulating resin 39 is cured in a pressed state, and further pressure can be applied in the thickness direction, due to the shrinking of insulating resin 39. As a result, the connection resistance between electrode terminals 33 of electronic part 32 and connection terminals 36 of substrate 35 can further be reduced.

Next, insulating resin 39 is cured by applying heat in the above state. As a result, electronic part 32 and substrate 35 are bonded and secured to each other. Electronic part mounting structure 30 is fabricated through the above steps.

Here, in the present exemplary embodiment, though an example where insulating resin 39 is formed on substrate 35 in advance is described, the invention is not limited thereto. Electronic part 32 and substrate 35 are positioned and pressed each other so that protruding electrodes 37 and connection terminals 36 are connected, and then, insulating resin 39 may be filled between electronic part 32 and substrate 35.

Hereinafter, the manufacturing method for protruding electrodes 37, which is an important element of the present exemplary embodiment, is described in reference to FIGS. 6A to 7B.

Figure 6A:
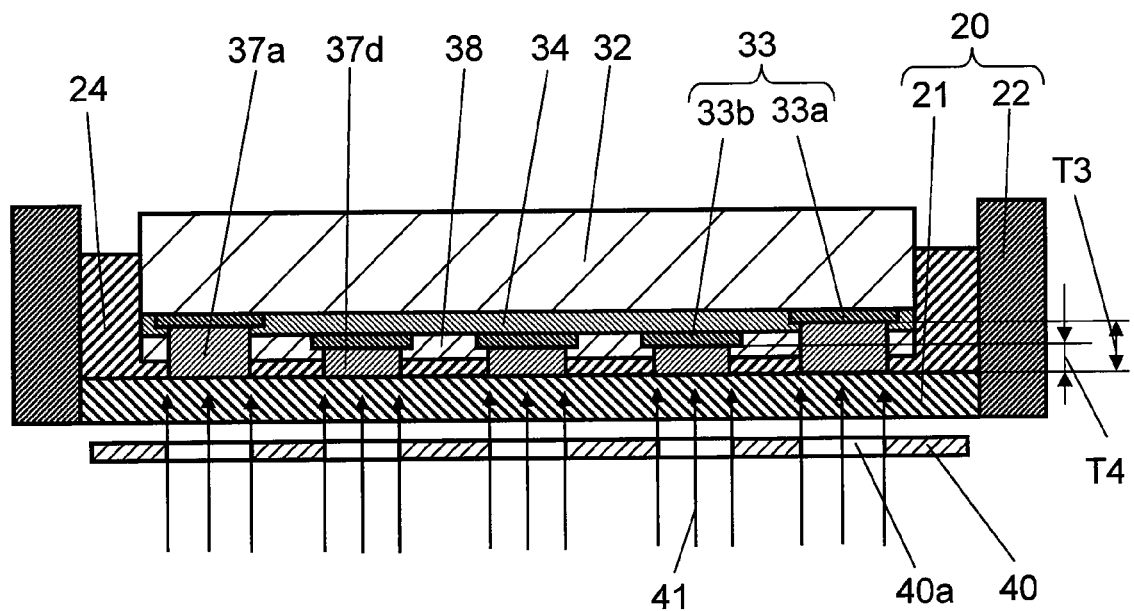
FIG. 6A is a cross sectional diagram illustrating the step of forming a first layer of protruding electrodes in the manufacturing method for the electronic part mounting structure according to the second exemplary embodiment.
Figure 6B:
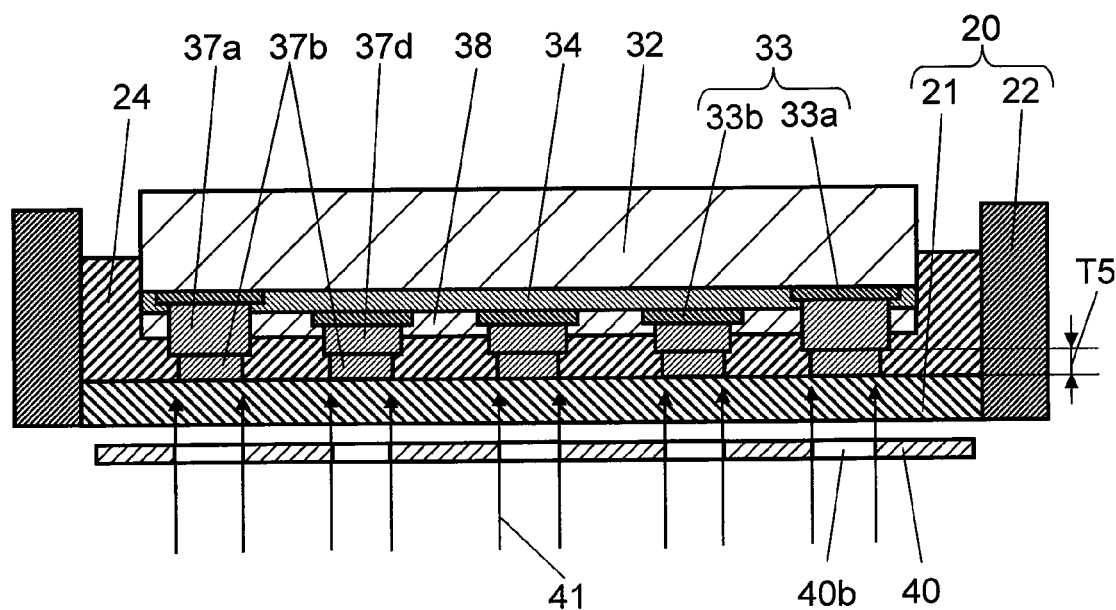
FIG. 6B is a cross sectional diagram illustrating the step of forming a second layer of protruding electrodes in the manufacturing method for the electronic part mounting structure according to the second exemplary embodiment.
Figure 7A:
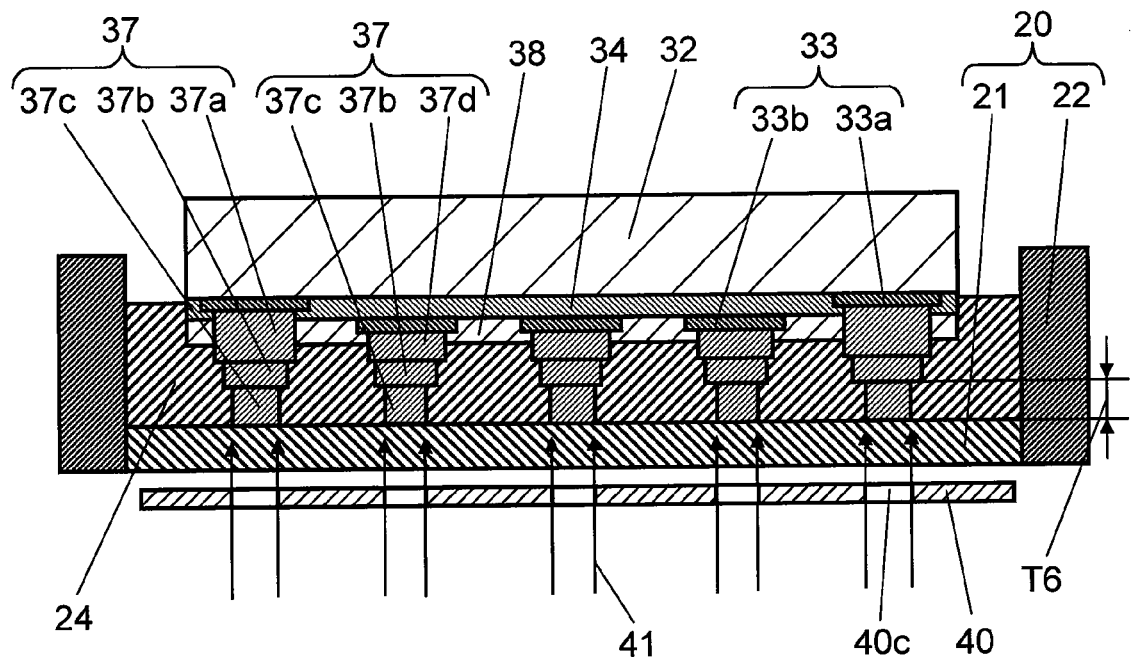
FIG. 7A is a cross sectional diagram illustrating the step of forming a third layer of protruding electrodes in the manufacturing method for the electronic part mounting structure according to the second exemplary embodiment.
Figure 7B:
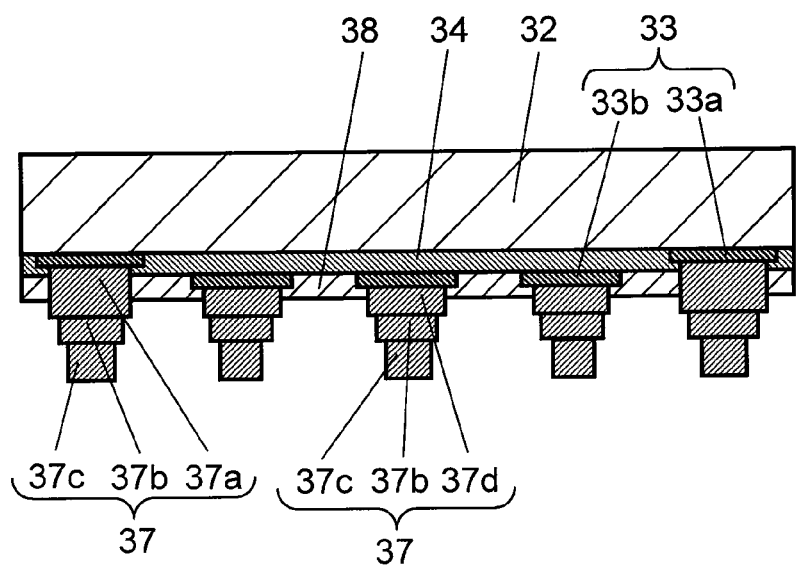
FIG. 7B is a cross sectional diagram showing an electronic part in the state after protruding electrodes are formed in the manufacturing method for the electronic part mounting structure according to the second exemplary embodiment.

FIGS. 6A, 6B, 7A and 7B are cross sectional diagrams illustrating the main steps in the manufacturing method for protruding electrodes 37. FIG. 6A is a cross sectional diagram illustrating the step of forming first layer 37a and 37d of protruding electrodes 37, and FIG. 6B is a cross sectional diagram showing the step of forming second layer 37b of protruding electrodes 37. In addition, FIG. 7A is a cross sectional diagram showing the step of forming third layer 37c of protruding electrodes 37, and FIG. 7B is a cross sectional diagram showing electronic part 32 in the state after protruding electrodes 37 are formed.

First, as shown in FIG. 6A, liquid resin 24 including a photosensitive resin which is sensitive to visible light and a conductive filler is fed to container 20 until at least electrode terminals 33 of electronic part 32 is immersed. In addition, container 20 is formed integrally of external periphery portion 22 and bottom portion 21, which is made of a transparent member, such as crystal or polyethylene terephthalate through which visible light for curing liquid resin 24 transmits.

Next, as shown in FIG. 6A, distance T4 between upper stage side electrode terminals 33b, among electrode terminals 33 formed on the main surface of electronic part 32, and bottom portion 21 is set to the thickness of first layer 37d of protruding electrodes 37. At this time, the lower stage side electrode terminals 33a and bottom portion 21 face each other in distance T3, which is greater than distance T4. Furthermore, photo mask 40, for example a liquid crystal panel or the like, is provided beneath bottom portion 21, and first openings 40a for forming first layer 37a and 37b of protruding electrodes 37 are formed in this photo mask 40. In addition, liquid resin 24 is irradiated from bottom portion 21 with visible light 41 through first openings 40a of photo mask 40. As a result, liquid resin 24 between electrode terminals 33 and bottom portion 21 is cured, so that first layer 37a and 37d of protruding electrodes 37 is formed. At this time, first layer 37a having a thickness corresponding to distance T3 is formed in lower stage side electrode terminals 33a of semiconductor element 32, and first layer 37d having a thickness corresponding to distance T4 is formed in upper stage side electrode terminals 33b. As a result, the surface of first layer 37a and 37d of the protruding electrodes is formed in the same plane.

Next, as shown in FIG. 6B, electronic part 32 is pulled up, so that distance T5 between first layer 37a and 37d of protruding electrodes 37 and bottom portion 21 is set to the thickness of second layer 37b of protruding electrodes 37. In addition, same as in FIG. 6A, liquid resin 24 is irradiated with visible light 41 from bottom portion 21 via photo mask 40. At this time, second openings 40b which are smaller than first openings 40a are provided in photo mask 40. As a result, liquid resin 24 between first layer 37a and 37b and bottom portion 21 is cured, so that second layer 37b of protruding electrode 37 is formed.

Next, as shown in FIG. 7A, electronic part 32 is pulled up further, so that distance T6 between second layer 37b of protruding electrodes 37 and bottom portion 21 is set to the thickness of third layer 37c of protruding electrodes 37. In addition, as in FIG. 6A, liquid resin 24 is irradiated from bottom portion 21 with visible light 41 via photo mask 40. At this time, third openings 40c which are smaller than second openings 40b are provided in photo mask 40. As a result, liquid resin 24 between second layer 37b and bottom portion 21 is cured, so that third layer 37c of protruding electrodes 37 is formed.

Next, electronic part 32 is taken out from container 20 and cleaned, so that unnecessary liquid resin is removed, and thus, as shown in FIG. 7B, an electronic part with protruding electrodes 37 of which the surface is formed in the same plane, that is to say, semiconductor element 32, can be obtained.

Here, a liquid crystal panel can be used as photo mask 40 in the present exemplary embodiment, as in the first exemplary embodiment. Furthermore, the protruding electrodes may be formed in accordance with a scale-down projection light exposure method, where a liquid crystal panel is used as photo mask 40 and the image of light that transmits through this liquid crystal panel is scale-down projected when liquid resin 24 is irradiated.

In addition, in the present exemplary embodiment, though an example where protruding electrodes 37 in truncated conical form are formed is described, the invention is not limited thereto, and the protruding electrodes may be in truncated, pyramid form, columnar form, prism form, conical form, pyramid form or cylindrical form, as in the first exemplary embodiment. Furthermore, in the present exemplary embodiment, though an example where the protruding electrodes are formed of a plurality of layers and each layer gradually become smaller in the configuration is described, the invention is not limited thereto. For example, a plurality of layers may have the same form, and furthermore, any configuration is possible such as a configuration where each layer may gradually become larger. The form and configuration of the protruding electrodes can be easily changed by controlling the openings of the above photo mask.

In addition, in the present exemplary embodiment, though examples where the protruding electrodes are made of a conductive resin are described, the invention is not limited thereto. A conductive coating of, such as nickel, copper, tin or gold, may be formed on the surface of the protruding electrodes through electroless plating or the like. Furthermore, a resist film is formed on the protective film, and a conductive thin film is formed through vapor deposition or sputtering, and then, the resist film is removed and a conductive coating film may be formed on the surface of the protruding electrodes. As a result, the contact resistance between the electrode terminals and the connection terminals through the protruding electrodes can be made small.

Hereinafter, another example of the electronic part mounting structure according to the second exemplary embodiment of the present invention is described in reference to FIG. 8.

Figure 8:
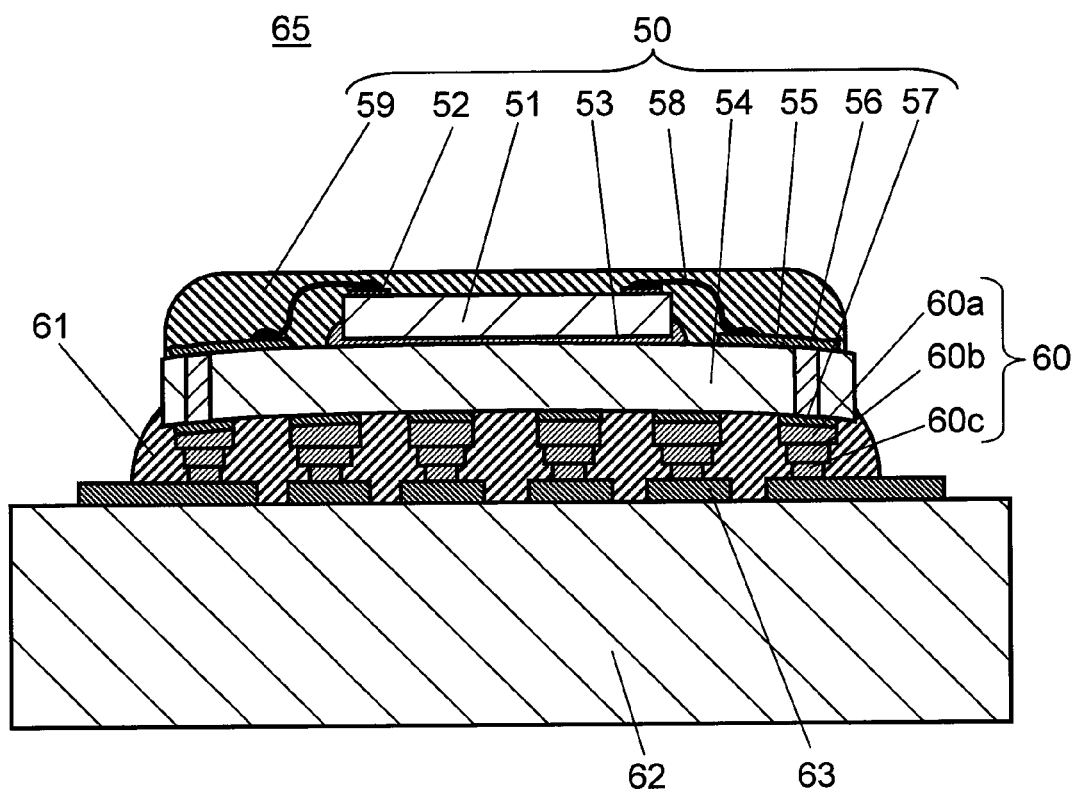
FIG. 8 is a cross sectional diagram showing another example of the electronic part mounting structure according to the second exemplary embodiment.

FIG. 8 is a cross sectional diagram showing another example of the electronic part mounting structure according to the second exemplary embodiment of the present invention. Thus, as shown in FIG. 8, electronic part mounting structure 65 according to the present exemplary embodiment includes a package configuration where semiconductor chip 51 is mounted on wiring substrate 54 in electronic part 50, which is connected to protruding electrodes 60 provided on substrate 62 and wiring substrate 54.

That is to say, as shown in FIG. 8, electronic part mounting structure 65 is provided with electronic part 50 having a plurality of electrode terminals 57, substrate 62 provided with connection terminals 63 in locations corresponding to electrode terminals 57, and protruding electrodes 60 for connecting electrode terminals 57 and connection terminals 63. In addition, electrode terminals 57 of electronic part 50 and connection terminals 63 of substrates 62 are connected through protruding electrodes 60. Furthermore, protruding electrodes 60 are formed of a conductive resin including a photosensitive resin which is sensitive to visible light and a conductive filler.

Here, in electronic part 50, semiconductor chip 51 is die bonded to wiring substrate 54 through a die bonding material 53. In addition, electrode terminals 52 of semiconductor chip 51 and connection terminals 55 of wiring substrate 54 are connected through wire bonding using fine metal wires 58 made of gold or the like and sealed in a sealing resin 59 in the configuration. In addition, wiring substrate 54 is formed of a multilayer wiring structure where connection terminals 55 on the semiconductor chip 51 side and electrode terminals 57 formed on the opposite side are connected through penetrating conductors 56. At this time, electrode terminals 57 are formed on the entire surface of wiring substrate 54 with a constant pitch for alignment, for example.

In addition, insulating resin 61 is filled between electronic part 50 and substrate 62, and electronic part 50 and substrate 62 are bonded and secured to each other with insulating resin 61.

In addition, protruding electrodes 60 are in truncated conical form and formed of three layers: first layer 60a, second layer 60b and third layer 60c, which are layered in the height (thickness).

Here, electronic part 50 having a general package configuration, in many cases, is deformed when wiring substrate 54 warps, as shown in FIG. 8, due to the difference in the coefficient of thermal expansion in the step of sealing with a resin at the time of mounting. As a result, the semiconductor element may be damaged due to a defect in the connection or excessive pressing force when connected to the wiring substrate.

In electronic part mounting structure 65 according to the present exemplary embodiment, however, even in a case where electronic part 50, which is in a package, is deformed such as warping, the surface of protruding electrodes 60 is in the same plane in response to the deformity, and thus, a defect in the connection can be prevented and electronic part 50 can be connected to connection terminals 63 on substrate 62 with a small pressing force. In a case where the amount of deformity, such as warping, is 50 µm, the protruding electrodes may be formed in such a manner that the height is 70 µm in the center portion of the semiconductor element and 20 µm in the corner portions. In addition, protruding electrodes 60 can be formed in the same manner as in the second exemplary embodiment, and therefore, the same effects can be obtained.

Here, the above electronic part mounting structure 65 and protruding electrodes 60 can be fabricated in accordance with the same manufacturing method as in the second exemplary embodiment, and therefore, descriptions thereof are not given.

Here, in the first and second exemplary embodiments, though examples where an insulating resin is filled between the electronic part and the substrate which is to be bonded and secured to each other in the configuration are described, the invention is not limited thereto. The electronic part and the substrate may be connected and bonded and secured to each other using an anisotropic conductive resin, for example. Concretely, an anisotropic conductive resin is formed on the surface of the electronic part where electrode terminals are formed or on the surface of the substrate where connection terminals are formed before the electronic part and the substrate are positioned, and after the connection, the anisotropic conductive resin is cured so that the electronic part and the substrate are connected and bonded and secured to each other. In accordance with this method, the electronic part and the substrate can be bonded without failure and firmly, and thus, the reliability in the connection increases. In addition, an adhesiveness is not particularly required in the protruding electrodes made of a conductive resin, and therefore, freedom in the selection of the photosensitive resin can be made great.

In addition, in the first and second exemplary embodiments, aramid multilayer substrates, resin bases such as PET (polyethylene terephthalate) or a glass epoxy resin, and circuit substrates formed of a ceramic base or a single crystal silicon base can be used as the substrate.

Third Exemplary Embodiment

Figure 9:
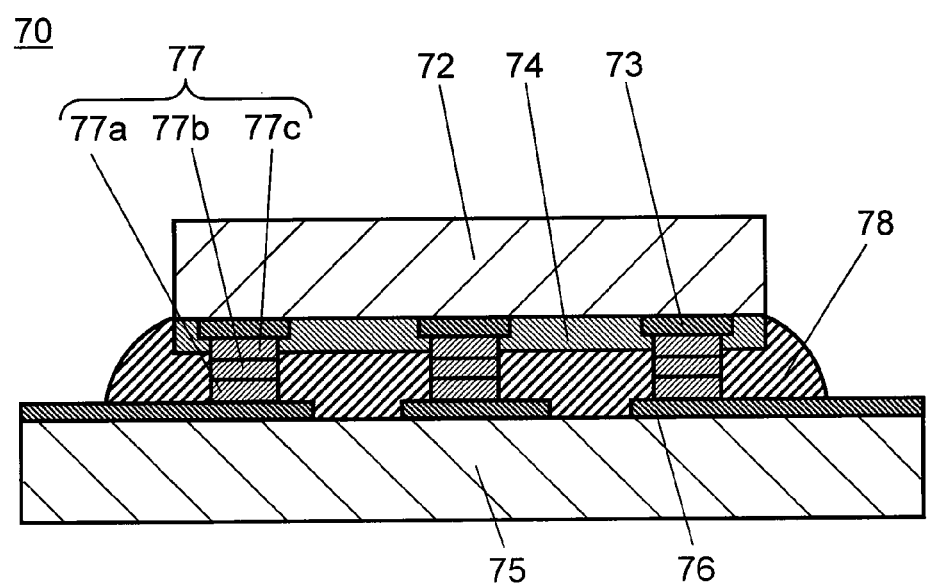
FIG. 9 is a cross sectional diagram showing the configuration of the electronic part mounting structure according to a third exemplary embodiment of the present invention.

FIG. 9 is a cross sectional diagram showing the configuration of electronic part mounting structure 70 according to the third exemplary embodiment of the present invention. As shown in FIG. 9, electronic part mounting structure 70 is provided with electronic part 72 having a plurality of electrode terminals 73, substrate 75 provided with connection terminals 76 in locations corresponding to electrode terminals 73, and protruding electrodes 77 for connecting electrode terminals 73 and connection terminals 76. In addition, protruding electrodes 77 are formed of a conductive resin including a photosensitive resin which is sensitive to visible light and a conductive filler. Here, the material for forming the conductive resin and the properties thereof are the same as in the first exemplary embodiment, and therefore, descriptions thereof are not given.

In addition, in the present exemplary embodiment, protruding electrodes 77 are approximately in columnar form and are not substantially a layer structure. Furthermore, insulating resin 78 is filled between electronic part 72 and substrate 75, and electronic part 72 and substrate 75 are bonded and secured to each other with insulating resin 78.

In addition, in the present exemplary embodiment, a case where a bare chip semiconductor element is used as electronic part 72 is described as an example, and the bare chip semiconductor element may be referred to as electronic part 72 or semiconductor element 72. In addition, electronic part 72 is the same as electronic part 2 described in the first exemplary embodiment in the basic configuration, and protective film 74 is formed such that it surrounds electrode terminals 73 and electronic parts 72. Here, this protective film 74 is not always necessary.

In addition, substrate 75 is provided with a transparent base through which visible light transmits and connection terminals 76 made of a transparent conductive thin film which is formed on the surface of this transparent base and through which at least visible light transmits. In addition, this substrate 75 has protruding electrodes for integrally connecting connection electrode 76 and electrode terminals 73, which are formed of a conductive resin made of a photosensitive resin which is sensitive to visible light and a conductive filler which holds substrate 75 and electronic part 72 at a set distance through exposure via a photo mask.

In electronic part mounting structure 70 according to the present exemplary embodiment, protruding electrodes 77 are made of a flexible conductive resin, and therefore, absorb stress due to thermal impact or mechanical impact, and thus, an electronic part mounting structure having excellent reliability where connection defect is difficult to be caused can be obtained.

In addition, protruding electrodes 77 are integrally formed of a conductive resin through exposure between electrode terminals 73 of electronic part 72 and connection terminals 76 of substrate 75, and therefore, it is not necessary to mount electronic part 72 on substrate 75 by applying a pressing force. As a result, even in a case where electrode terminals 73 are provided on the circuit forming surface of the semiconductor element, which is electronic part 72, the circuit on the circuit forming surface can be prevented from being damaged by a pressing force. In particular, even a semiconductor element for the application with a high frequency having an insulating film of a low dielectric constant which is mechanically weak can be prevented from being damaged, and an electronic part mounting structure having small fluctuations in the properties can be realized. Therefore, in a case where it is desired that electronic parts are mounted through the application of a low load, for example, when a driver IC or the like is mounted on a display substrate for a liquid crystal display or an EL display, the invention is particularly effective.

Hereinafter, the manufacturing method for an electronic part mounting structure according to the third exemplary embodiment of the present invention is described in reference to FIGS. 10A to 11B.

Figure 10A:
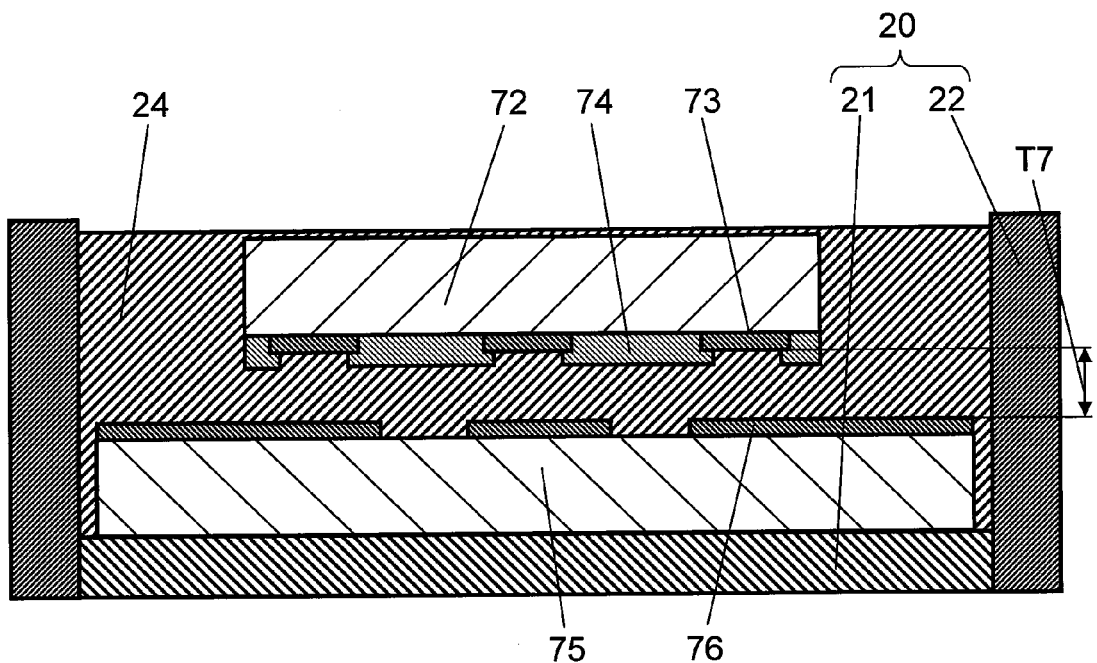
FIG. 10A is a cross sectional diagram showing a state where an electronic part and a substrate are immersed in a liquid resin including a photosensitive resin and a conductive filler in the manufacturing method for the electronic part mounting structure according to the third exemplary embodiment.
Figure 10B:
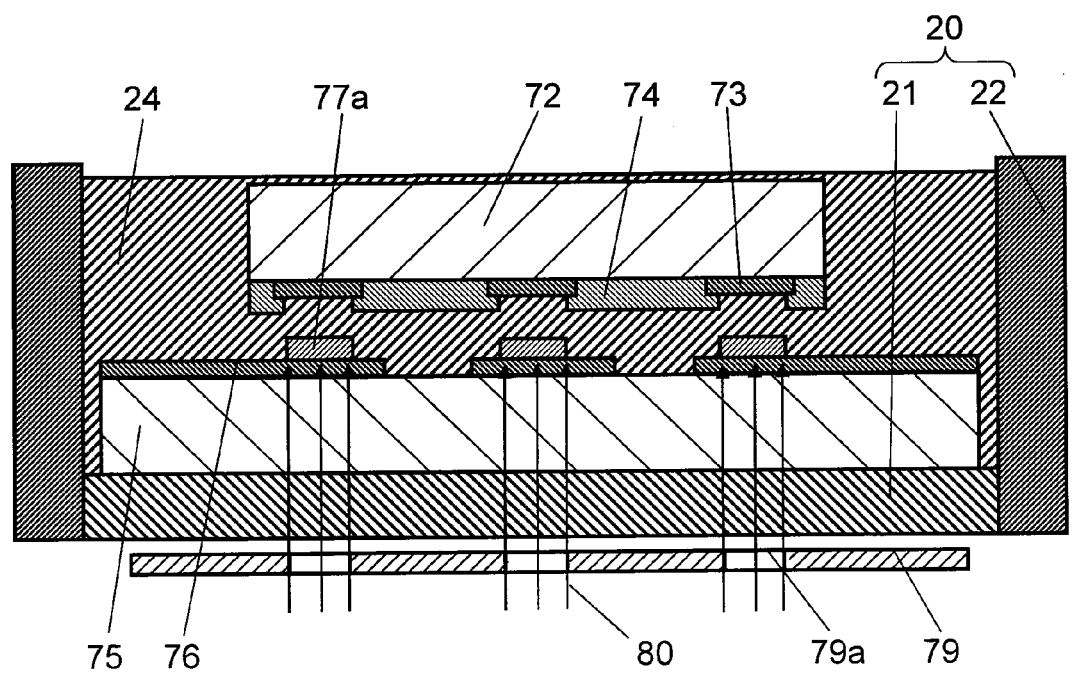
FIG. 10B is a cross sectional diagram showing the state that a first layer of protruding electrodes is formed through irradiation with light having a first light intensity in the manufacturing method for the electronic part mounting structure according to the third exemplary embodiment.
Figure 11A:
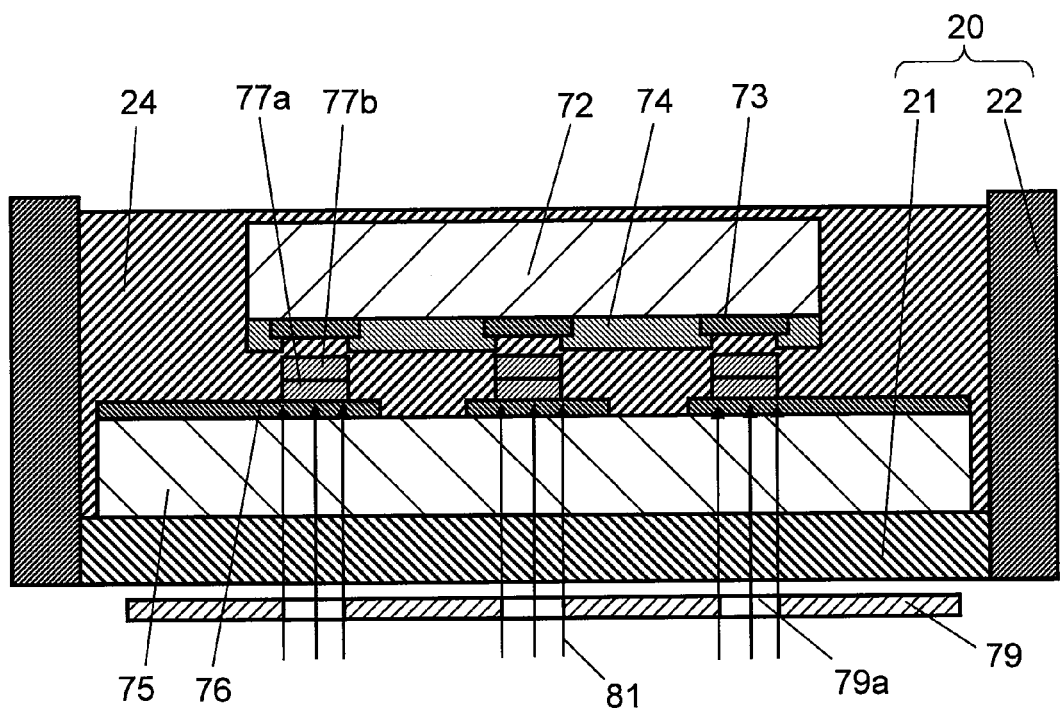
FIG. 11A is a cross sectional diagram showing the state that a second layer of protruding electrodes is formed through irradiation with light having a second light intensity in the manufacturing method for the electronic part mounting structure according to the third exemplary embodiment.
Figure 11B:
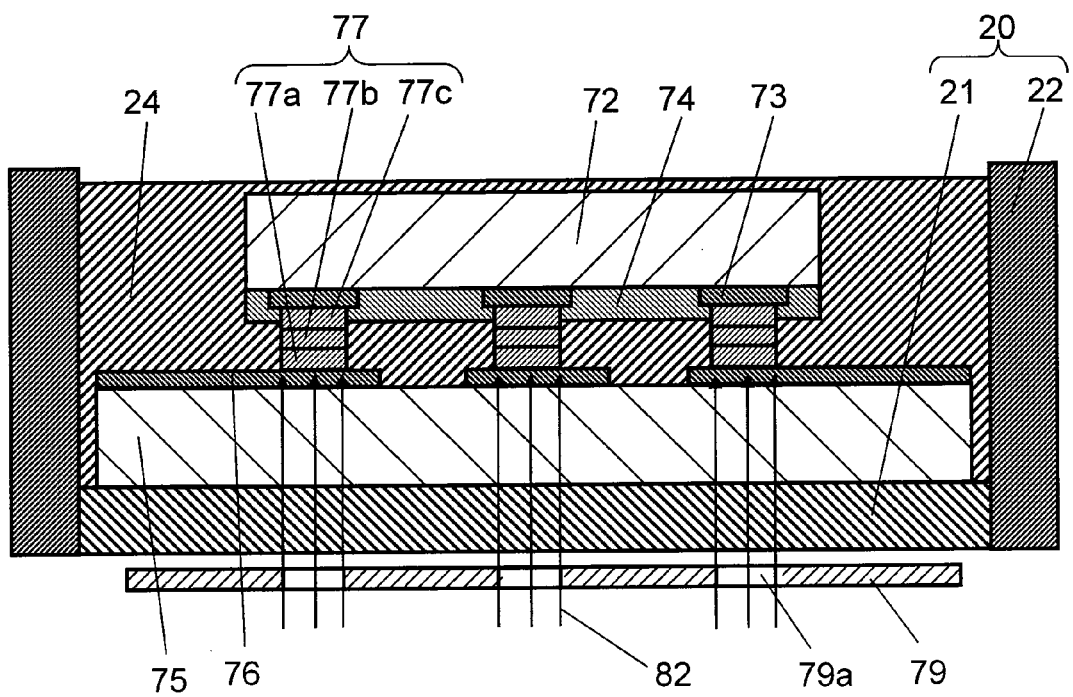
FIG. 11B is a cross sectional diagram showing the state that a third layer of protruding electrodes is formed through irradiation with light having a third light intensity and the electrode terminals and the connection terminals are connected in the manufacturing method for the electronic part mounting structure according to the third exemplary embodiment.

FIGS. 10A, 10B, 11A and 11B illustrate the main steps in the manufacturing method for electronic part mounting structure 70 according to the third exemplary embodiment of the present invention. In addition, FIG. 10A is a cross sectional diagram showing a state where electronic part 72 and substrate 75 are immersed in liquid resin 24 including a photosensitive resin which is sensitive to visible light and a conductive filler. FIG. 10B is a cross sectional diagram showing a state where first layer 77a of protruding electrodes 77 is formed through irradiation with visible light 80 having a first light intensity. In addition, FIG. 1A is a cross sectional diagram showing a state where second layer 77b of protruding electrodes 77 is formed through irradiation with visible light 81 having a second light intensity. Furthermore, FIG. 11B is a cross sectional diagram showing a state where third layer 77c of protruding electrodes 77 is formed through irradiation with visible light 82 having a third light intensity so that electrode terminals 73 and connection terminals 76 are connected.

First, as shown in FIG. 10A, container 20 integrally formed of outer periphery portion 22 and bottom portion 21 made of a transparent member, such as crystal, through which visible light for curing liquid resin 24 transmits is filled with liquid resin 24 including a photosensitive resin which is sensitive to visible light and a conductive filler. In addition, electronic part 72 and substrate 75 are positioned so that electrode terminals 73 and connection terminals 76 face each other, and electronic part 72 and substrate 75 are immersed in liquid resin 24 in such a state that distance T7, which is required as the height of protruding electrodes 77, is set between electrode terminals 73 and connection terminals 76. At this time, electronic part 72 and substrate 75 are secured so as to maintain distance T7 by means of a jig (not shown).

Next, as shown in FIG. 10B, photo mask 79, which is, for example, a liquid crystal panel, is provided beneath bottom portion 21 of container 20, and openings 79a having a shape for forming protruding electrodes 77 are formed in photo mask 79. Here, these openings 79a have approximately the same form as electrode terminals 73. In addition, liquid resin 24 is irradiated with visible light 80 having a first light intensity from bottom portion 21 via openings 79a of photo mask 79. As a result, portions of liquid resin 24 are cured between electrode terminals 73 and bottom portion 21 so that first layer 77a of protruding electrodes 77 is formed. Here, the thickness of this first layer 77a depends on the first light intensity of visible light 80, the time of irradiation and the material for forming the conductive resin.

Next, as shown in FIG. 11A, liquid resin 24 is irradiated with visible light 81 having the second light intensity from bottom portion 21 via openings 79a of photo mask 79 with electronic part 72, substrate 75 and photo mask 79 being secured to each other. At this time, the second light intensity of visible light 81 is set to be higher than the first light intensity. As a result, visible light 81 that has transmitted through openings 79a transmits through first layer 77a that has been cured between electrode terminals 73 and bottom portion 21, and makes portions of liquid resin 24 lying thereon are cured, and thus, second layer 77b of protruding electrodes 77 is formed. Here, the thickness of this second layer 77b also depends on the second light intensity of visible light 81, the time of irradiation and the material for forming the conductive resin.

Next, as shown in FIG. 11B, liquid resin 24 is irradiated with visible light 82 having the third light intensity from bottom portion 21 via openings 79a of photo mask 79 with electronic part 72, substrate 75 and photo mask 79 being secured to each other. At this time, the third light intensity of visible light 82 is set to be higher than the second light intensity. As a result, visible light 82 that has transmitted through openings 79a transmits through first layer 77a and second layer 77b that have been cured between electrode terminals 73 and bottom portion 21, and makes portions of liquid resin 24 lying thereon are cured, and thus, third layer 77c of protruding electrodes 77 is formed. Here, the thickness of this third layer 77c seldom depends on the third light intensity of visible light 82 in a case where the thickness of liquid resin 24 remaining on second layer 77b is small. However, it is desirable to irradiate liquid resin 24 which remains in this region with visible light having a sufficiently great light intensity in order to cure the liquid resin without fail.

In the above described steps, electrode terminals 73 of electronic part 72 and connection terminals 76 of substrate 75 are connected via protruding electrodes 77 made of first layer 77a, second layer 77b and third layer 77c.

Next, electronic part 72 and substrate 75 are taken out from container 20 in such state that electrode terminals 73 and connection terminals 76 are integrated via protruding electrodes 77 and cleaned so that the unnecessary liquid resin 24 is removed. Then, if necessary, insulating resin 78 is injected into the space (distance T7) formed by protruding electrodes 77 and cured so that electronic part 72 and substrate 75 are bonded and secured to each other, and thus, electronic part mounting structure 70 is fabricated. As a result, the electronic part and the substrate are integrated more firmly, and therefore, defects can be prevented from being caused in the connection even when being subjected to thermal impact or mechanical impact and the reliability can be increased.

Here, in the present exemplary embodiment, though an example where the light intensity is increased step by step so that protruding electrodes 77 are formed of three layers is described, the invention is not limited thereto. In some cases, for example, the size of openings 79a is constant and the conductive resin material is the same, and therefore, a clear layer structure is not obtained in some cases, as shown in FIG. 9. In addition, the protruding electrodes may be formed through irradiation where the light intensity is continuously increased.

Here, in the same manner as in the first exemplary embodiment, a liquid crystal panel can be used as photo mask 79 used in the present exemplary embodiment. Furthermore, a liquid crystal panel is used as photo mask 79 so that the protruding electrodes may be formed in accordance with a scale-down projection light exposure method where the image of light that has transmitted through this liquid crystal panel is scale-down projected when liquid resin 24 is irradiated. In addition, a general photo mask which is used in a process for forming various types of thin film devices may be used.

Here, in the first exemplary embodiment to third exemplary embodiment, though a liquid crystal panel is described as an example of the photo mask, the invention is not limited thereto. A plurality of photo masks for the forms of the respective openings are prepared, and the masks are replaced in accordance with the form of the openings when exposed so that protruding electrodes made of a plurality of layers are formed, for example.

In addition, in the first exemplary embodiment to third exemplary embodiment, though an example where protruding electrodes are fabricated with one type of liquid resin, that is, a conductive resin including a photosensitive resin which is sensitive to visible light and a conductive filler, is described, the invention is not limited thereto. Protruding electrodes in layers which are different in at least one of the hardness, modulus of elasticity and conductivity may be fabricated by combining various types of conductive resins as described in the first exemplary embodiment, for example. That is to say, a plurality of liquid resins having different hardness, modulus of elasticity or conductivity are prepared, and an electronic part is put in these liquid resins one by one when exposed so that protruding electrodes having layers with different properties can be formed. An example where the end portions of the protruding electrodes are formed of 82% by weight of silver particles and the portions in the vicinity of the electrode terminals are formed of 87% by weight of silver particles can be included. At this time, the modulus of elasticity of the end portions of the protruding electrodes is 100 MPa and the modulus of elasticity in the vicinity of the electrode terminals is 800 MPa. As a result, it becomes easier that the end portions of the protruding electrodes are deformed under a low load. That is to say, protruding electrodes which are deformed under a low load and have optimal resistance in the connection can be formed in accordance with the difference in the coefficient of thermal expansion between the electronic part and the substrate and the mechanical strength of the insulating film of the electronic part. As a result, a defect can further be prevented from being caused in the connection between the electrode terminals and the connection terminals, and an electronic part mounting structure having a high reliability can be obtained.

In addition, in the first exemplary embodiment to third exemplary embodiment, though an example where protruding electrodes are formed using visible light is described, the invention is not limited thereto. Protruding electrodes may be formed using a photosensitive resin which is sensitive to ultraviolet rays or of which the peak sensitivity is 500 nm or less, for example. At this time, it is preferable to use a photo mask which is conventionally used in photolithography or the like instead of a photo mask using liquid crystal cells in order to avoid reduction in the productivity due to deterioration of the liquid crystal.

Hereinafter, the properties of the protruding electrodes formed in the above exemplary embodiments and the conditions for forming a conductive resin are concretely described with respect to Examples. Here, the present invention is not limited to the following Examples.

Embodied Example 1

In accordance with the above exemplary embodiments, protruding electrodes in pyramid form are formed on electrode terminals of a semiconductor element of a 5 mm square.

Here, a conductive resin was used which was prepared by mixing a photosensitive resin, including a multifunctional monomer, a monofunctional monomer and a photopolymerization initiator, and conductive fillers as follows. Two types of conductive fillers were used: fine silver particles having an average particle diameter of 3 $\mu$m (40 parts by weight) and fine silver particles having an average particle diameter of 1.3 $\mu$m (20 parts by weight). As the multifunctional monomer included in the photosensitive resin, dipentaerythritol hexaacrylate (30 parts by weight) and trimethyrol propane triacrylate (10 parts by weight) were used. As the monofunctional monomer, methyl methacrylate (2.55 parts by weight) and butyl acrylate (2.55 parts by weight) were used. As the photopolymerization initiator, an acetophenone derivative (3 parts by weight) was used.

At this time, the viscosity of the liquid resin for forming the protruding electrodes made of a conductive resin was 0.8 Pa·s when measured at 25° C. using a cone plate type viscometer.

In addition, a semiconductor element was used where ten electrode terminals with a pitch of 200 $\mu$m in both the longitudinal and the lateral directions, that is, 100 electrode terminals in total, were formed.

First, a predetermined container was filled with the liquid resin, and the semiconductor element was mounted on a stage with the electrode terminal surface facing beneath and was immersed in the container. At this time, the distance between the electrode terminal surface of the semiconductor element and the transparent member of the container was adjusted to 10 $\mu$m. As a result, the liquid resin flowed into the space between the electrode terminal surface of the semiconductor element and the transparent member, and the liquid resin having a thickness of 10 μm was interposed between the transparent member and the semiconductor element.

Then, a liquid crystal panel where the form of the openings was controlled by a computer was used as a photo mask. Ten first openings, which were 70 μm squares, were aligned with a pitch of 200 μm in both the longitudinal and lateral directions, that is, 100 first openings in total were arranged in the liquid crystal panel.

The liquid resin which was interposed between the surface to be exposed and the surface of the semiconductor element was irradiated with light having an energy of 500 mJ/cm$^2$ from an ultrahigh pressure mercury lamp having a wavelength of 436 nm, and thus, the first layer of the protruding electrodes where the upper surface was a 70 μm square and the thickness was 10 μm was formed.

Next, the stage was further moved upward along the z axis by 10 μm, and thus, the liquid resin having a thickness of 10 μm was interposed between the transparent member and the first layer. In the liquid crystal panel, a 70 μm square was changed to a 62 μm square, and thus, second openings were provided. The liquid resin supplied on the first layer was again irradiated with light having an energy of 450 mJ/cm$^2$ from an ultrahigh pressure mercury lamp. Thus, a second layer, of which the upper surface was a 62 μm square and the thickness was 10 μm, was formed on the first layer.

The same operation was carried out when the size of the openings of the liquid crystal panel was changed to a 54 μm square and a 46 μm square, and thus, protruding electrodes made of four layered films were formed in pyramid form where the bottom was a 70 μm square and the height was 40 μm.

The semiconductor element was taken out from the container, and the surface thereof was cleaned through air blowing so that the uncured liquid resin was removed. Then, the formed protruding electrodes were heat treated for two hours at 270° C. As a result, protruding electrodes in pyramid form were formed on the electrode terminals of the semiconductor element.

The obtained protruding electrodes were confirmed to be in pyramid form having almost no distortion. The height of the protruding electrodes was uniform.

In addition, the resistance of the protruding electrodes was measured using a resistivity measuring apparatus, and it was found to be 50 mΩ.

As described above, protruding electrodes in pyramid form can be collectively formed on a plurality of electrode terminals of a semiconductor element through exposure using a liquid crystal panel as a photo mask placed above the electrode terminals of the semiconductor element. Furthermore, multilayered protruding electrodes can be formed on the surface of the electrode terminals of a semiconductor element or the like in order to increase the density of the mounted parts.

In the following Embodied Examples, a change in the cured depth of the conductive resin when the average particle diameter of the conductive filler included in the conductive resin and the energy of light with which the conductive resin was irradiated were changed, as well as a change in the cured depth of the conductive resin when the amount of the conductive filler in the conductive resin and the energy of light were changed were examined.

Embodied Example 2

The relationship was examined between the energy of light with which the liquid resin for forming the protruding electrodes is irradiated, the average particle diameter of the conductive filler included in the liquid resin and the cured depth of the liquid resin.

A conductive filler and a photosensitive resin, as follows, were used, and a liquid resin was prepared in the same manner as in Embodied Example 1. Spherical silver particles were used as the conductive filler, and the average particle diameter was 0.31 μm, 3.0 μm and 7.0 μm.

Urethane acrylate oligomer, acrylate monomer, benzyl dimethyl ketal and a hydrophobic polymer were used as the photosensitive resin. At this time, the viscosity of the liquid resin was 0.8 Pa·s when measured at 25° C. using a corn plate type viscometer.

The ratio of mixture of the conductive filler and the photosensitive resin was 50:50 in the weight ratio.

The liquid resin which formed the conductive resin obtained in the above was irradiated with light having a predetermined energy so as to be cured, and the cured depth of the resin at this time was measured. The energy of light for irradiation was 0.5 J/cm$^2$, 1 J/cm$^2$, 5 J/cm$^2$ and 10 J/cm$^2$.

Figure 12:
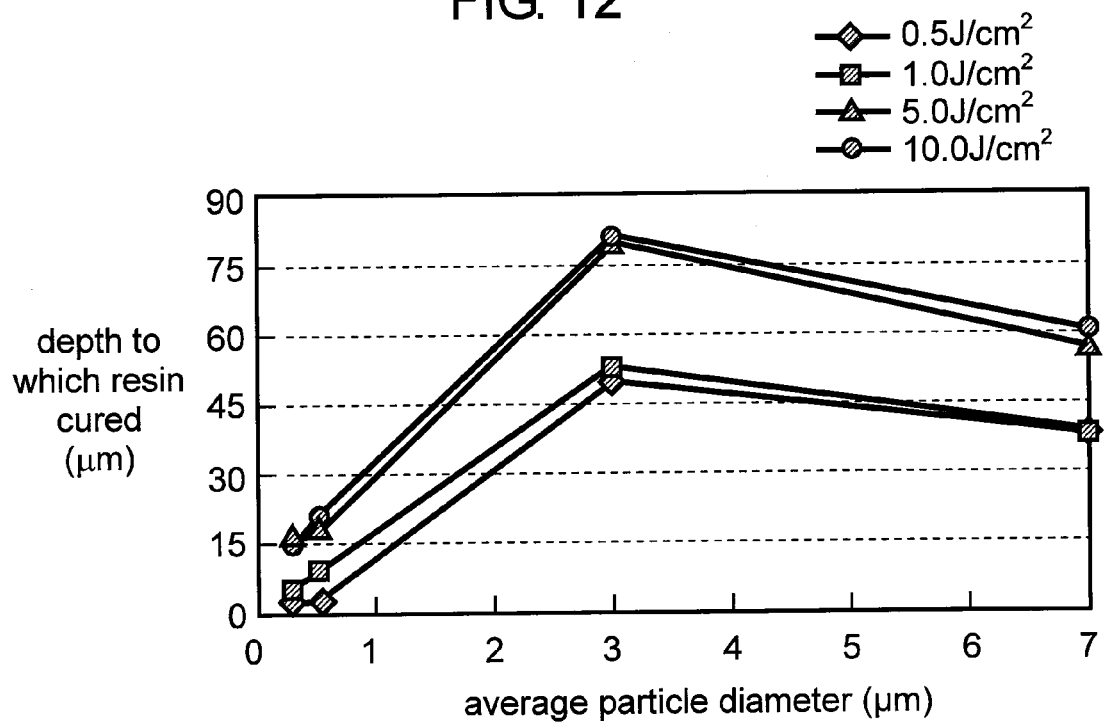
FIG. 12 is a graph showing the relationship between the average particle diameter in the conductive filler included in the liquid resin of the present invention and the depth to which the liquid resin is cured.

The obtained results are shown in FIG. 12. It can be seen from FIG. 12 that the greater the average particle diameter of the conductive filler is, up to the average particle diameter being 3 μm, the deeper the cured resin is. It is considered because the space between the particles of the conductive filler is great. Meanwhile, when the average particle diameter of the conductive filler is greater than 3 μm, the conductive filler prevents light from transmitting, and therefore, it can be seen that the cured depths gradually becomes shallower.

Embodied Example 3

In the present Embodied Example, the relationship was examined between the amount of the conductive filler included in the liquid resin, the energy level of light with which the liquid resin was irradiated, and the cured depth of the liquid resin.

The liquid resin was prepared in the same manner as in Embodied Example 2, except that the amount of silver particles included in the liquid resin was 30% by weight, 40% by weight, 50% by weight, 60% by weight or 70% by weight. Here, the average particle diameter of the used silver particles was 3 μm.

The thus obtained each liquid resin was used, and the cured depth was measured at the time when the energy level of light with which the liquid resins were irradiated was varied.

Figure 13:
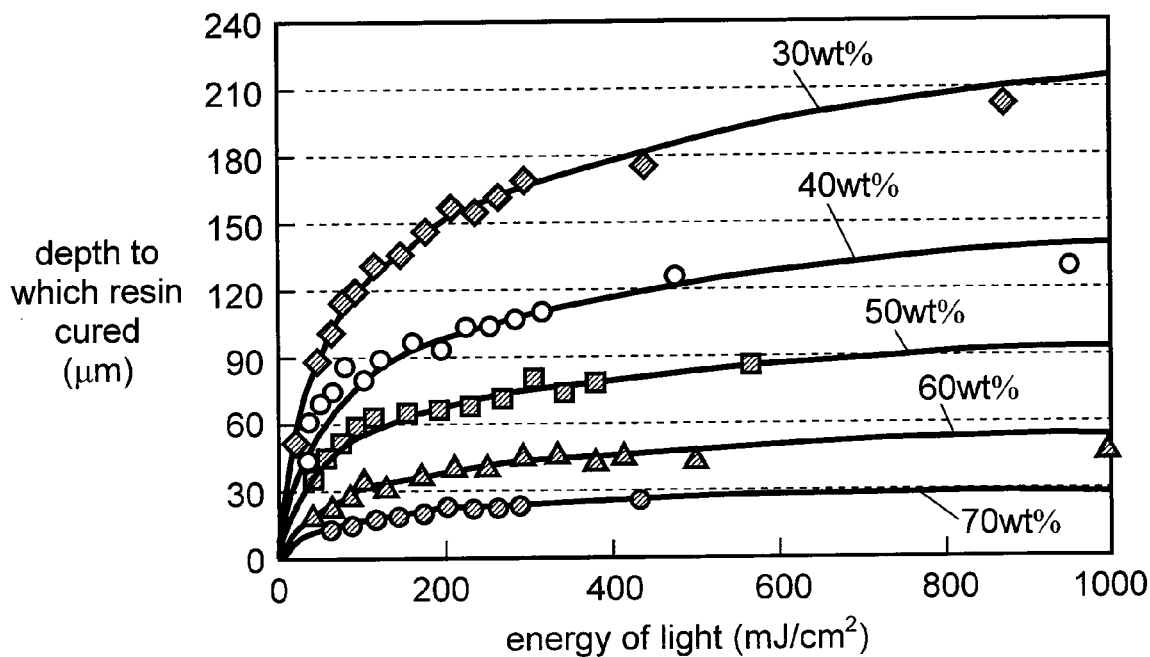
FIG. 13 is a graph showing the relationship between the energy of the light with which the liquid resin of the present invention is irradiated and the depth to which the liquid resin is cured.

The obtained results are shown in FIG. 13. It can be seen from FIG. 13 that the cured depth of the liquid resins was 60 μm even when the amount of the conductive filler in the liquid resins was 50% by weight in a case where the energy level of light was 200 mJ/cm$^2$, for example.

INDUSTRIAL APPLICABILITY

In the electronic part mounting structure of the present invention, an electronic part and a substrate can be connected via flexible protruding electrodes having a large aspect ratio, and therefore, the electronic part mounting structure is useful for various electronics where high reliability is required, even when thermal impact or mechanical impact is applied, in particular, in the field of portable electronics.

The invention claimed is:
1. A method for manufacturing an electronic part mounting structure, comprising:
  forming a protruding electrode made of a conductive resin
    including a photosensitive resin and a conductive filler on an electrode terminal of an electronic part or on a connection terminal of a substrate;

positioning the electronic part or the substrate on which the protruding electrode is formed so that the electrode terminal and the connection terminal face each other with the protruding electrode interposed therebetween; and connecting the electrode terminal and the connection terminal with the protruding electrode interposed therebetween by pressing the electronic part, wherein the forming of the protruding electrode comprises:

supplying a liquid resin including a photosensitive resin and a conductive filler to a container through which at least light transmits a bottom thereof;

immersing an electronic part where a plurality of electrode terminals are formed on one surface into the liquid resin in such a direction that the electrode terminal faces the bottom and has a predetermined distance relative to the bottom;

forming a first layer collectively on top of a plurality of the electrode terminals by curing the liquid resin on the electrode terminal through selective irradiation with light via a first opening of a photo mask from the bottom of the container;

pulling the electronic part up from the bottom by a predetermined distance;

forming a second layer on the first layer by curing the liquid resin on the first layer through selective irradiation with light using a photo mask having a second opening which is smaller than the first opening; and forming the protruding electrode having a layer structure by repeating the pulling of the electronic part and the forming of the second layer sequentially.

2. The method for manufacturing an electronic part mounting structure according to claim 1, wherein the bottom is made of the photo mask.

3. The method for manufacturing an electronic part mounting structure according to claim 1, wherein the forming of the protruding electrode comprises:

supplying a liquid resin including a photosensitive resin and a conductive filler to a container;

immersing an electronic part where a plurality of electrode terminals are formed on one surface into the liquid resin in such a manner that the electrode terminal has a predetermined distance relative to the surface of the liquid resin;

forming a first layer collectively on a plurality of the electrode terminals by curing the liquid resin on the electrode terminal through selective irradiation with light via the first opening of a photo mask from the surface of the liquid resin;

lowering the electronic part down into the liquid resin by a predetermined distance;

forming a second layer on the first layer by curing the liquid resin on the first layer through selective irradiation with light using a photo mask having the second opening which is smaller than the first opening; and forming the protruding electrode having a layer structure by repeating the lowering of the electronic part and the forming the second layer sequentially.

4. The method for manufacturing an electronic part mounting structure according to claim 1, wherein the forming of the electrode comprises:

supplying the liquid resin including the photosensitive resin and the conductive filler onto the electronic part on which the electrode terminal is formed in a thickness corresponding to the thickness of the protruding electrode; and growing the protruding electrode by curing the liquid resin on the electrode terminal through selective irradiation of the liquid resin with light via an opening of a photo mask while the intensity of light is gradually increased.

* * * * *